(12) United States Patent
Kim et al.

(10) Patent No.: US 12,272,867 B2
(45) Date of Patent: Apr. 8, 2025

(54) ANTENNA STRUCTURE INCLUDING INTERPOSER AND ELECTRONIC DEVICE INCLUDING SAME

(71) Applicant: Samsung Electronics Co., Ltd., Suwon-si (KR)

(72) Inventors: Jiho Kim, Suwon-si (KR); Seongyong An, Suwon-si (KR); Sehyun Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 17/903,504

(22) Filed: Sep. 6, 2022

(65) Prior Publication Data

US 2022/0416409 A1    Dec. 29, 2022

Related U.S. Application Data

(63) Continuation of application No. PCT/KR2021/014947, filed on Oct. 22, 2021.

(30) Foreign Application Priority Data

Oct. 23, 2020  (KR) .................. 10-2020-0138428

(51) Int. Cl.
*H01Q 1/38*      (2006.01)
*H01Q 1/24*      (2006.01)
(Continued)

(52) U.S. Cl.
CPC ............... *H01Q 1/38* (2013.01); *H01Q 1/24* (2013.01); *H01Q 5/25* (2015.01); *H04M 1/0268* (2013.01); *H04M 1/0277* (2013.01); *H05K 1/14* (2013.01)

(58) Field of Classification Search
CPC .. H01Q 1/38; H01Q 1/24; H01Q 5/25; H01Q 1/243; H01Q 1/526; H01Q 1/46;
(Continued)

(56) References Cited

U.S. PATENT DOCUMENTS 5,202,648 A * 4/1993 McCandless ........... H01P 5/107
                                                    333/33
5,982,250 A * 11/1999 Hung ..................... H01L 23/66
                                                    257/E23.062
(Continued)

FOREIGN PATENT DOCUMENTS

CN         103066385 B  *  8/2015
KR    10-2019-0029215 A     3/2019
(Continued)

OTHER PUBLICATIONS

Korean Office Action dated Nov. 19, 2024, issued in Korean Application No. 10-2020-0138428.

*Primary Examiner* — Ricardo I Magallanes
*Assistant Examiner* — Jordan E. DeWitt
(74) *Attorney, Agent, or Firm* — Jefferson IP Law, LLP

(57) ABSTRACT

A printed board assembly (PBA) is provided. The PBA includes first printed circuit board (PCB), a second PCB disposed parallel to the first PCB and including a conductive area, a first interposer surrounding a space between the first PCB and the second PCB, and a wireless communication circuit, wherein the interposer may include a first partition wall structure configured to provide shielding for at least one electronic component disposed in the PBA, and a second partition wall structure connected to the first partition wall structure and including an dielectric material, the second partition wall structure including a conductive via configured to connect the first PCB and the second PCB, and the wireless communication circuit may transmit and/or receive (Continued)

a signal in a specified frequency band by feeding power to the conductive area of the second PCB through the conductive via.

16 Claims, 38 Drawing Sheets

(51) Int. Cl.
  *H01Q 5/25* (2015.01)
  *H04M 1/02* (2006.01)
  *H05K 1/14* (2006.01)
(58) Field of Classification Search
  CPC .. H04M 1/0268; H04M 1/0277; H04M 1/026; H05K 1/14; H05K 1/0216; H05K 2201/042; H05K 2201/10371; H05K 2201/10378; H05K 2201/2018; H05K 1/144; H05K 2201/0723; H05K 2201/0707
  See application file for complete search history.

(56) References Cited

U.S. PATENT DOCUMENTS

| | | | |
|---|---|---|---|
| 6,239,669 B1* | 5/2001 | Koriyama | H01P 5/107 333/26 |
| 6,417,812 B1* | 7/2002 | Tsai | H01Q 1/46 439/131 |
| 6,958,662 B1* | 10/2005 | Salmela | H01P 5/107 333/33 |
| 7,019,600 B2* | 3/2006 | Shono | H01P 5/107 333/33 |
| 7,095,292 B2* | 8/2006 | Sayanagi | H01P 5/107 333/33 |
| 7,196,274 B2* | 3/2007 | Cooper | H05K 3/4652 174/262 |
| 7,479,841 B2* | 1/2009 | Stenger | H01P 5/107 333/33 |
| 7,701,310 B2* | 4/2010 | Fujita | H01P 5/107 333/26 |
| 7,804,443 B2* | 9/2010 | Nagaishi | H01P 5/107 333/248 |
| 8,022,784 B2* | 9/2011 | Lee | H01P 5/107 333/34 |
| 8,362,608 B2* | 1/2013 | Ju | H01L 23/66 257/E23.114 |
| 8,680,936 B2* | 3/2014 | Purden | H01P 5/107 333/254 |
| 8,912,859 B2* | 12/2014 | Leiba | H01P 11/002 333/26 |
| 9,000,851 B1* | 4/2015 | Oran | H03B 5/1817 331/107 DP |
| 9,054,404 B2* | 6/2015 | Wang | H01P 5/107 |
| 9,219,041 B2* | 12/2015 | Elad | H01L 23/66 |
| 9,286,812 B2* | 3/2016 | Bohn | H10K 50/84 |
| 9,300,054 B2* | 3/2016 | Martin | H01Q 1/38 |
| 9,496,593 B2* | 11/2016 | Dayan | H01P 5/107 |
| 9,577,310 B2* | 2/2017 | Kuwabara | H01L 23/12 |
| 9,583,811 B2* | 2/2017 | Seler | H01P 5/107 |
| 9,871,299 B2* | 1/2018 | Ganchrow | H01Q 1/243 |
| 10,931,013 B2 | 2/2021 | Cooper et al. | |
| 10,938,090 B2 | 3/2021 | Jung et al. | |
| 11,101,536 B2* | 8/2021 | Hsiao | H01P 5/1022 |
| 11,218,583 B2 | 1/2022 | Lee et al. | |
| 11,612,051 B1* | 3/2023 | White | H05K 1/0222 |
| 2003/0050094 A1* | 3/2003 | Boyle | H01Q 1/245 455/557 |
| 2003/0174095 A1* | 9/2003 | Sievenpiper | H01Q 13/18 343/770 |
| 2005/0264469 A1* | 12/2005 | Nowotarski | H01Q 1/242 343/895 |
| 2006/0061555 A1* | 3/2006 | Mullen | G06F 1/1637 345/169 |
| 2007/0069970 A1* | 3/2007 | Argaman | H01Q 15/168 343/912 |
| 2007/0146243 A1* | 6/2007 | Ou Yang | G06F 1/1601 345/76 |
| 2010/0090913 A1* | 4/2010 | Liu | H01Q 1/48 343/702 |
| 2010/0182205 A1* | 7/2010 | Chiang | H01Q 1/2266 343/702 |
| 2011/0140979 A1* | 6/2011 | Dayan | H01P 3/121 333/208 |
| 2011/0309899 A1* | 12/2011 | Leiba | H01Q 1/38 333/208 |
| 2012/0182066 A1* | 7/2012 | Merkle | H05K 1/185 427/508 |
| 2013/0127669 A1* | 5/2013 | Han | H01Q 9/0485 343/700 MS |
| 2013/0187818 A1* | 7/2013 | Desclos | H01Q 1/526 343/770 |
| 2013/0271925 A1* | 10/2013 | Ikuta | H05K 7/026 361/736 |
| 2014/0111392 A1* | 4/2014 | Ou | H01P 1/20 333/24 R |
| 2014/0266939 A1* | 9/2014 | Baringer | H01Q 1/22 343/729 |
| 2015/0340782 A1 | 11/2015 | Amini et al. | |
| 2016/0162775 A1* | 6/2016 | Zeng | G08B 13/2434 235/375 |
| 2017/0117620 A1* | 4/2017 | Lapushin | H01Q 9/0421 |
| 2017/0250460 A1* | 8/2017 | Shin | H04M 1/0277 |
| 2017/0250466 A1* | 8/2017 | Schlaffer | H05K 3/4697 |
| 2018/0006360 A1* | 1/2018 | Camacho Perez | H01Q 21/28 |
| 2018/0068938 A1 | 3/2018 | Yazdani | |
| 2018/0218986 A1 | 8/2018 | Kamgaing | |
| 2019/0058264 A1* | 2/2019 | Jung | H01Q 9/0435 |
| 2019/0081393 A1* | 3/2019 | Zhou | H05K 5/0017 |
| 2019/0082536 A1 | 3/2019 | Park et al. | |
| 2019/0173195 A1* | 6/2019 | Kim | H01Q 21/065 |
| 2019/0261519 A1* | 8/2019 | Park | G06F 1/1677 |
| 2019/0305430 A1* | 10/2019 | Thai | H01Q 1/2283 |
| 2019/0313529 A1 | 10/2019 | Kim et al. | |
| 2019/0319381 A1 | 10/2019 | Bang et al. | |
| 2020/0093040 A1 | 3/2020 | Yun et al. | |
| 2020/0243948 A1* | 7/2020 | Kim | H01Q 5/385 |
| 2021/0036418 A1* | 2/2021 | Lin | H01Q 5/328 |
| 2022/0294109 A1* | 9/2022 | Larsen | H01Q 9/42 |
| 2022/0416409 A1* | 12/2022 | Kim | H01Q 5/25 |
| 2022/0418123 A1* | 12/2022 | Liu | H04M 1/0237 |
| 2023/0228843 A1* | 7/2023 | Foroozanfard | G01S 7/028 342/175 |
| 2023/0344147 A1* | 10/2023 | Rodriguez De Luis | H01Q 21/0025 |

FOREIGN PATENT DOCUMENTS

| | | |
|---|---|---|
| KR | 10-2019-0125461 A | 11/2019 |
| KR | 10-2020-0032911 A | 3/2020 |
| KR | 10-2020-0116415 A | 10/2020 |

* cited by examiner

ANTENNA STRUCTURE INCLUDING INTERPOSER AND ELECTRONIC DEVICE INCLUDING SAME

CROSS-REFERENCE TO RELATED APPLICATION(S)

This application is a continuation application, claiming priority under § 365 (c), of an International application No. PCT/KR2021/014947, filed on Oct. 22, 2021, which is based on and claims the benefit of a Korean patent application number 10-2020-0138428, filed on Oct. 23, 2020, in the Korean Intellectual Property Office, the disclosure of which is incorporated by reference herein in its entirety.

TECHNICAL FIELD

The disclosure relates to an antenna structure including an interposer and an electronic device including the same. More particularly, the disclosure relates to an electronic device including a flexible display which secures a pattern antenna mounting space and reduce antenna performance degradation through an antenna structure using an interposer and a printed circuit board (PCB).

BACKGROUND ART

Electronic devices tend to have smaller sizes while having more diversified functions, and it has thus become important to secure spaces for arrangement of electronic components (for example, processors, communication circuits, or memories) for performing various functions of electronic devices.

In order to secure spaces in which electronic components can be arranged, an increasing number of electronic devices have recently used interposers to form a stacked structure of multiple PCBs. For example, an electronic device may have multiple stacked PCBs and may have an interposer which has at least one via for electrically connecting PCBs, and which is arranged between the stacked PCBs, thereby securing a space in which electronic components can be arranged.

In addition, in response to such demands for small sizes and multiple functions, electronic devices may adopt a flexible display such that the size of the flexible display, which is visually exposed, can be varied, thereby providing both large screens and portability. For example, an electronic device employing a flexible display may secure portability if the display is partially rolled into the electronic device and thus reduced, and may provide a large screen when the display is expanded.

The above information is presented as background information only to assist with an understanding of the disclosure. No determination has been made, and no assertion is made, as to whether any of the above might be applicable as prior art with regard to the disclosure.

DISCLOSURE OF INVENTION

An electronic device employing a flexible display may have a limited area in which an antenna using a conductive pattern, such as laser direct structuring (LDS), can be arranged, compared with an electronic device of the related art. For example, at least a part of the flexible display may be arranged in an area in which an antenna may be arranged, thereby reducing the area in which an antenna may be arranged.

In addition, in the case of a rollable or slidable electronic device, the antenna connecting structure may become longer, thereby increasing the line loss and degrading the antenna radiation performance.

Aspects of the disclosure are to address at least the above-mentioned problems and/or disadvantages and to provide at least the advantages described below. Accordingly, an aspect of the disclosure is to provide an electronic device including a flexible display which secures a pattern antenna mounting space and reduce antenna performance degradation through an antenna structure using an interposer and a printed circuit board (PCB).

Additional aspects will be set forth in part in the description which follows and, in part, will be apparent from the description, or may be learned by practice of the presented embodiments.

Solution to Problem

In accordance with an aspect of the disclosure, a printed board assembly (PBA) is provided. The PBA includes a first PCB, a second PCB disposed parallel to the first PCB and configured to include a conductive area, a first interposer surrounding a space between the first PCB and the second PCB, and a wireless communication circuit, wherein the first interposer include a first partition wall structure configured to provide shielding for at least one electronic component disposed on the PBA and a second partition wall structure connected to the first partition wall structure and configured to include a dielectric material, the second partition wall structure including a conductive via configured to connect the first PCB and the second PCB, wherein the wireless communication circuit is configured to transmit and/or receive a signal in a specified frequency band by feeding power to the conductive area of the second PCB through the conductive via.

In accordance with another aspect of the disclosure, an electronic device is provided. The electronic device includes a housing including a first housing and a second housing coupled to the first housing to be movable with respect to the first housing, a flexible display coupled to the housing and having a display area shown to the outside of the electronic device and expanded or reduced in at least one direction according to a movement of the second housing, a PBA disposed in the housing, and a wireless communication circuit, wherein the PBA includes a first PCB, a second PCB disposed parallel to the first PCB, the second PCB including a conductive area, and an interposer surrounding a space between the first PCB and the second PCB, wherein the interposer includes a first partition wall structure configured to provide shielding for at least one electronic component disposed on the PBA and a second partition wall structure connected to the first partition wall structure and configured to include a dielectric material, the second partition wall structure including a conductive via configured to connect the first PCB and the second PCB, wherein the wireless communication circuit is configured to transmit or receive a signal in a specified frequency band by feeding power to the conductive area of the second PCB through the conductive via.

Advantageous Effects of Invention

According to various embodiments of the disclosure, an electronic device may have an antenna implemented using a PCB structure of a stacked structure, thereby improving the space availability of the electronic device.

According to various embodiments of the disclosure, a separate flexible radio frequency (RF) cable (FRC) connecting structure for connecting an antenna and a wireless communication circuit may be omitted, thereby reducing line loss caused by an increased connecting structure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

BEST MODE FOR CARRYING OUT THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
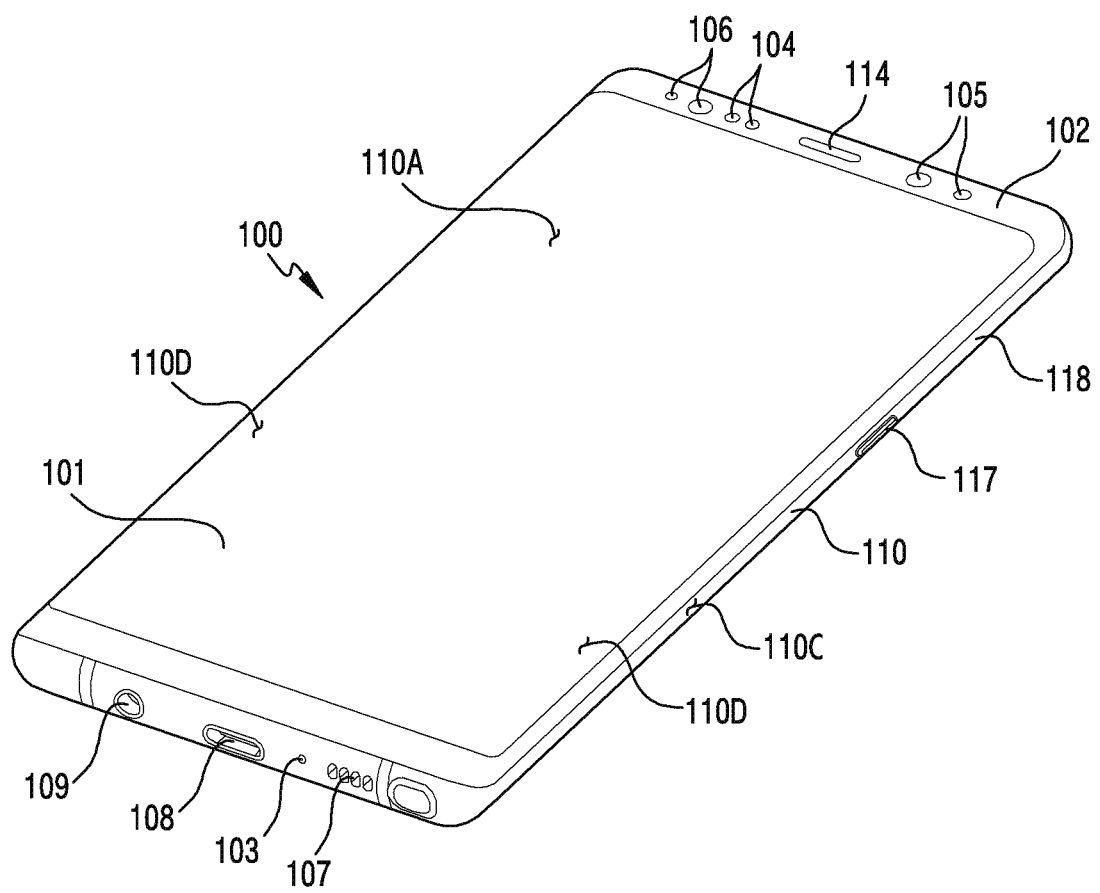
FIG. 1 is a perspective view illustrating a front surface of an electronic device according to an embodiment of the disclosure.

FIG. 1 is a perspective view illustrating a front surface of an electronic device according to an embodiment of the disclosure.

Figure 2:
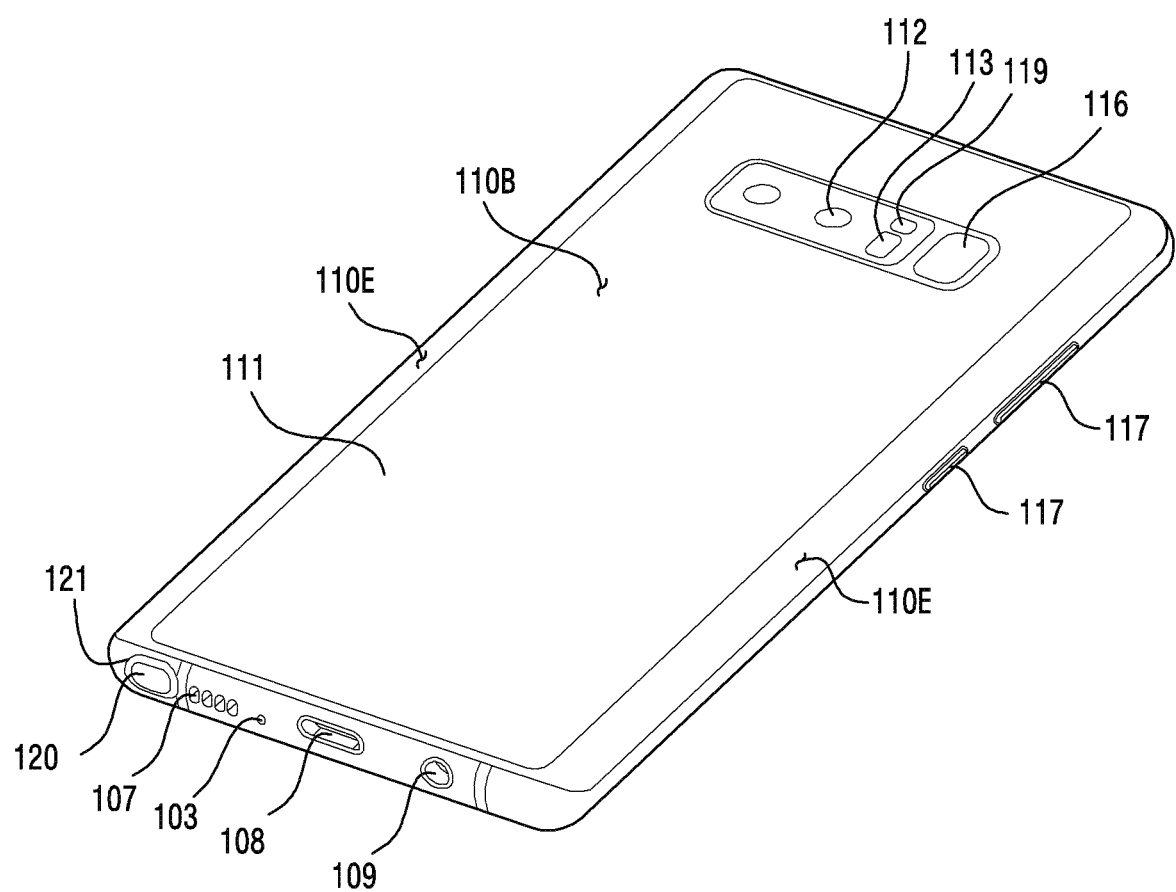
FIG. 2 is a perspective view illustrating a rear surface of an electronic device of FIG. 1 according to an embodiment of the disclosure.

FIG. 2 is a perspective view illustrating a rear surface of the electronic device of FIG. 1 according to an embodiment of the disclosure.

Referring to FIGS. 1 and 2, the electronic device 100 according to an embodiment may include a housing 110 including a first surface (or front surface) 110A, a second surface (or rear surface) 110B, and a lateral surface 110C surrounding a space between the first surface 110A and the second surface 110B. In another embodiment (not shown), the housing may refer to a structure forming a portion of the first surface 110A, the second surface 110B, and the lateral surface 110C in FIG. 1. According to an embodiment of the disclosure, at least a portion of the first surface 110A may be formed of substantially transparent front plate 102 (e.g., glass plate including various coating layers or polymer plate). The second surface 110B may be formed of the substantially opaque rear plate 111. The rear plate 111 may be formed by, for example, coated or colored glass, ceramic, polymers, metals (e.g., aluminum, stainless steel (STS), or magnesium), or a combination of at least two thereof. The lateral surface 110C may be coupled to the front plate 102 and the rear plate 111 and may be formed by a lateral bezel structure (or "lateral member") 118 including a metal and/or polymer. In an embodiment of the disclosure, the rear plate 111 and the lateral bezel structure 118 may be integrally formed and include the same material (e.g., metal material, such as aluminum).

In an illustrated embodiment of the disclosure, the front plate 102 may include two first areas 110D seamlessly extending from the first surface 110A to be bent toward the rear plate 111 at the opposite ends of a long edge of the front plate 102. In the illustrated embodiment (see FIG. 2) of the disclosure, the rear plate 111 may include two second areas 110E seamlessly extending from the second surface 110B to be bent toward the front plate 102 at the opposite ends of the long edge. In an embodiment of the disclosure, the front plate 102 (or the rear plate 111) may include only one of the first areas 110D (or the second areas 110E). In another embodiment of the disclosure, a part of the first areas 110D or the second areas 110E is not included. In the embodiment of the disclosure, when viewed from a lateral side of the electronic device 100, the lateral bezel structure 118 may have a first thickness (or width) at a lateral surface in which the first areas 110D and the second areas 110E are not included, and may have a second thickness thinner than the first thickness at a lateral surface in which the first areas 110D and the second areas 110E are included.

According to an embodiment of the disclosure, the electronic device 100 may include at least one of a display 101, an audio module 103, 107, or 114, a sensor module 104, 116, or 119, a camera module 105, 112, or 113, a key input device 117, a light emitting element 106, a pen input device 120, and a connector hole 108 or 109. In an embodiment of the disclosure, the electronic device 100 may omit one of components (e.g., a key input device 117 or light emitting element 106) or may additionally include another component.

The display 101 may be exposed through, for example, a substantial portion of the front plate 102. In an embodiment of the disclosure, at least a part of the display 101 may be exposed through the front plate 102 forming the first surface 110A and the first areas 110D of the lateral surface 110C. In an embodiment of the disclosure, an edge of the display 101 may be formed to be substantially identical to a frame shape adjacent to the front plate 102. In another embodiment (not shown), in order to expand an area through which the display 101 is exposed, a gap between a frame of the display 101 and a frame of the front plate 102 may be roughly constant.

In another embodiment (not shown) of the disclosure, the display 101 may include a recess or an opening formed on a part of a screen display area, and may include at least one of an audio module 114, a sensor module 104, a camera module 105, and a light emitting element 106 which are arranged with the recess or the opening. In another embodiment (not shown) of the disclosure, the display 101 may include at least one of an audio module 114, a sensor module 104, a camera module 105, a fingerprint sensor 116, and a light emitting element 106 on a rear surface of a screen display area. In another embodiment (not shown), the display 101 may be combined to or disposed adjacent to a touch sensing circuit, a pressure sensor for measuring a strength (pressure) of a touch, and/or a digitizer for detecting a magnetic field-type stylus pen. In an embodiment of the disclosure, at least a part of the sensor module 104 or 119 and/or at least a part of the key input device 117 may be disposed on the first areas 110D and/or the second area 110E.

The audio module 103, 107, or 114 may include a microphone hole 103 and a speaker hole 107 or 114. A microphone for obtaining a sound from outside may be disposed in the microphone hole 103 and in an embodiment of the disclosure, multiple microphones are arranged to detect a direction of a sound. The speaker hole 107 or 114 may include an outer speaker hole 107 and a receiver hole 114 for calling. In an embodiment of the disclosure, a speaker hole 107 or 114 and a microphone hole 103 may be integrated into one hole and a speaker may be included without a speaker hole 107 or 114 (e.g., piezo speaker).

The sensor module 104, 116, or 119 may generate an electrical signal or a data value corresponding to an internal operation state or external environment state of the electronic device 100. The sensor module 104, 116, or 119 may include a first sensor module 104 (e.g., a proximity sensor) disposed on the first surface 110A of the housing 110 and/or a second sensor module (not shown) (e.g., a fingerprint sensor), and/or a third sensor module 119 (e.g., an HRM sensor) and/or a fourth sensor module 116 (e.g., a fingerprint sensor) disposed on the second surface 110B of the housing 110. The fingerprint sensor may be disposed not only on the first surface 110A (e.g., display 101) but also on the second surface 110B of the housing 110. The electronic device 100 may further include at least one unillustrated sensor module, for example, a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera module 105, 112, or 113 may include the first camera device 105 disposed on the first surface 110A of the electronic device 100 and the second camera device 112 disposed on the second surface 110B, and/or a flash 113. The camera devices 105 and 112 may include one or more of lenses, an image sensor, and/or an image signal processor. The flash 113 may include, for example, a light emitting diode or a xenon lamp. In an embodiment of the disclosure, two or more lenses (infrared camera, and wide-angle or telephoto lens) and image sensors may be arranged on one surface of the electronic device 100.

The key input device 117 may be disposed on the lateral surface 110C of the housing 110. In another embodiment of the disclosure, the electronic device 100 may not include a portion or entirety of the key input device 117 described above, and the excluded key input device 117 may be implemented as various forms, such as a soft key on the display 101. In an embodiment of the disclosure, the key input device may include a sensor module 116 disposed on the second surface 110B of the housing 110.

The light emitting element 106 may be disposed on the first surface 110A of the housing 110. The light emitting element 106 may provide state information of the electronic device 100 in a light form, for example. In another embodiment of the disclosure, the light emitting element 106 may provide, for example, a light source associated with an operation of the camera module 105. The light emitting element 106 may include, for example, a light emitting diode (LED), an infrared LED (IR LED), and a xenon lamp.

The connector hole 108 or 109 may include a first connector hole 108 capable of receiving a connector (e.g., a USB connector) for transmitting or receiving power and/or data to or from an external electronic device, and/or a second connector hole (e.g., an earphone jack) 109 capable of receiving a connector for transmitting or receiving an audio signal to or from an external electronic device.

The pen input device 120 (e.g., a stylus pen) may be guided to the inside of the housing 110 through a hole 121 formed on the lateral surface of the housing 110 to be inserted into or separated from the same, and may include a button for easy detachment or attachment. The pen input device 120 may have a separate resonance circuit installed therein to link to an electromagnetic induction panel 390 (e.g., digitizer) included in the electronic device 100. The pen input device 120 may include an electromagnetic resonance (EMR) method, an active electrical stylus (AES), and an electric coupled resonance (ECR) method.

Figure 3:
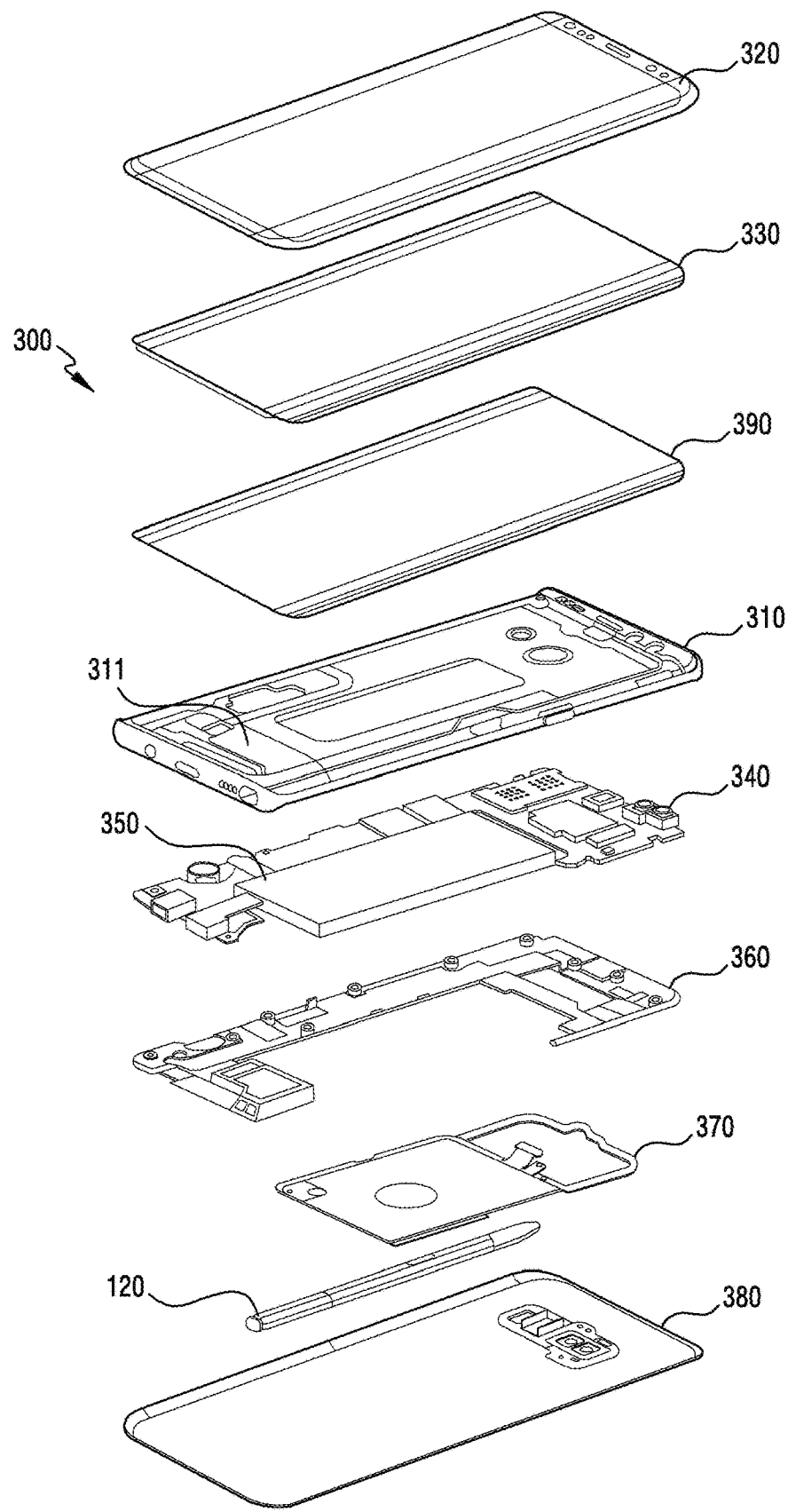
FIG. 3 is an exploded perspective view illustrating an electronic device of FIG. 1 according to an embodiment of the disclosure.

FIG. 3 is an exploded perspective view illustrating an electronic device of FIG. 1 according to an embodiment of the disclosure.

Referring to FIG. 3, an electronic device 300 may include a lateral bezel structure 310, a first support member 311 (e.g., a bracket), a front plate 320, a display 330, an electromagnetic induction panel 390, a printed circuit board 340, a battery 350, a second support member 360 (e.g., a rear case), an antenna 370, a pen input device 120, and a rear plate 380. In an embodiment of the disclosure, the electronic device 300 may omit at least one component (e.g., first support member 311 or second support member 360) or may additionally include another component. At least one component of the electronic device 300 may be the same as or similar to at least one component of the electronic device 100 of FIG. 1 or FIG. 2, and an overlapping description thereof will be omitted.

The electromagnetic induction panel 390 (e.g., a digitizer) may be a panel for detecting an input of the pen input device 120. For example, the electromagnetic induction panel 390 may include a printed circuit board (PCB) (e.g., a flexible printed circuit board (FPCB)) and a shield sheet. The shield sheet may prevent the components from a mutual interference caused by an electromagnetic field generated by components (e.g., a display module, a printed circuit board, an electromagnetic induction panel, and the like) in the electronic device 100. The shield sheet may block an electromagnetic field generated by the components and may thus allow an input from the pen input device 120 to be correctly transmitted to a coil included in the electromagnetic induction panel 240. The electromagnetic induction panel 240 according to various embodiments may include an opening formed at a part corresponding to a biometric sensor mounted to the electronic device 100.

The first support member 311 may be disposed in the electronic device 300 to be connected to the lateral bezel structure 310 or may be integrally formed with the lateral bezel structure 310. The first support member 311 may be formed of, for example, a metal material and/or non-metal (e.g., polymer) material. The first support member 311 may have one surface coupled to the display 330 and the other surface coupled to the printed circuit board 340. A processor, a memory, and/or an interface may be mounted on the printed circuit board 340. The processor may include one or more of, for example, a central processing unit, an application processor, a graphic processing device, an image signal processor, a sensor hub processor, or a communication processor.

The memory may include, for example, a transitory memory or a non-transitory memory.

The interface may include, for example, a high definition multimedia interface (HDMI), a universal serial bus (USB) interface, a secure digital (SD) card interface, and/or an audio interface. The interface may electrically or physically connect, for example, the electronic device 300 and an external electronic device and may include a USB connector, an SD card/multimedia card (MMC) connector, or an audio connector.

The battery 350 may be a device for supplying power to at least one component of the electronic device 300 and may include a non-rechargeable primary battery, or a rechargeable secondary battery, or a fuel cell. At least a part of the battery 350 may be disposed on a substantially identical plane to the printed circuit board 340. The battery 350 may be disposed in and integrated into the electronic device 300, and may be disposed in the electronic device 300 to be attachable and detachable.

The antenna 370 may be interposed between the rear plate 380 and the battery 350. The antenna 370 may include, for example, a near field communication (NFC) antenna, a wireless charging antenna, and/or a magnetic secure transmission (MST) antenna. The antenna 370 may transmit and receive power required for charging or perform near field communication with an external device, for example. In another embodiment of the disclosure, an antenna structure may be formed by a part or a combination of the lateral bezel structure 310 and/or the first support member 311.

Figure 4:
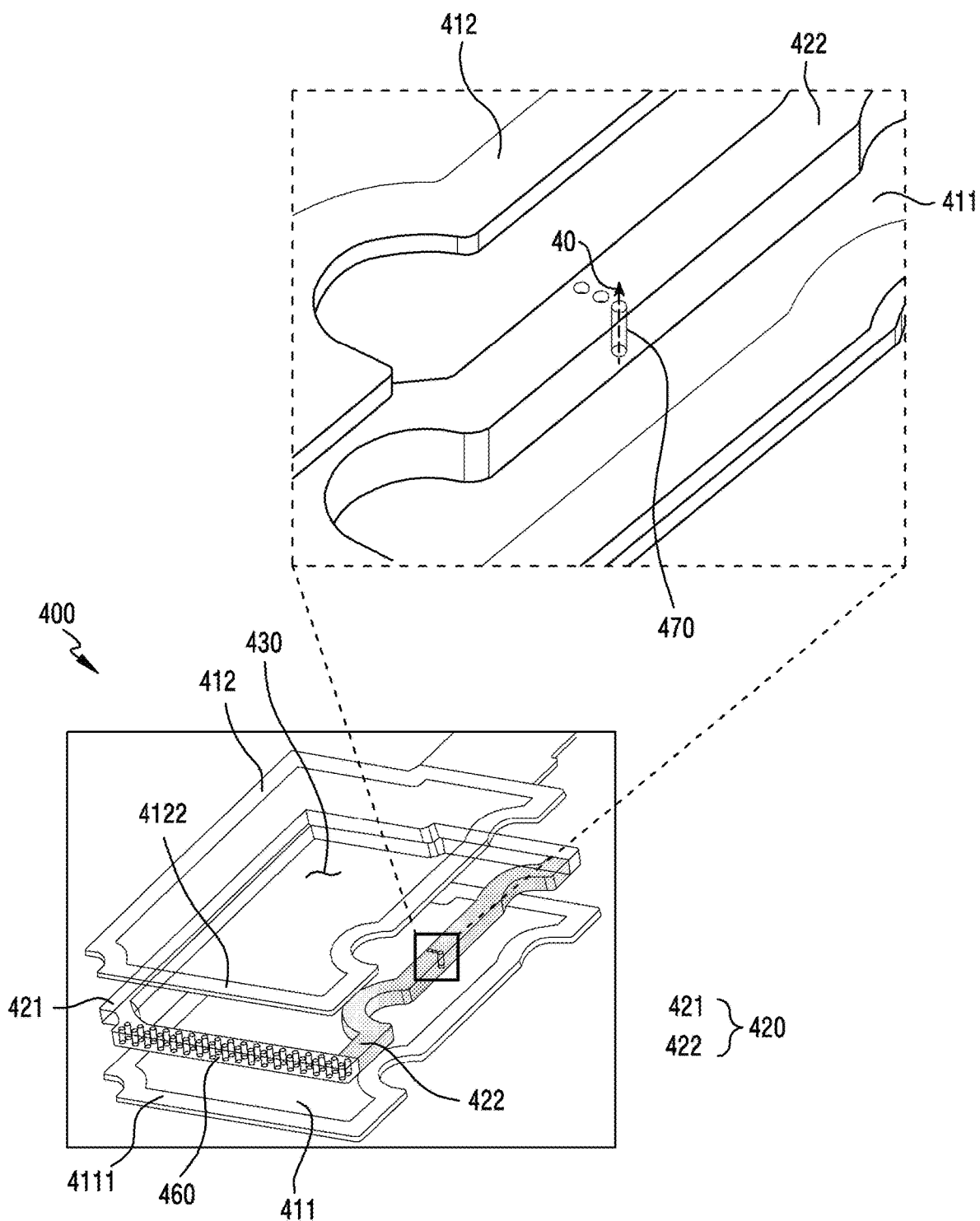
FIG. 4 is a view illustrating a printed board assembly (PBA) and an enlarged view of a partial area of the PBA according to an embodiment of the disclosure.

FIG. 4 is a view illustrating a printed board assembly (PBA) and an enlarged view of a partial area of the PBA according to an embodiment of the disclosure.

Referring to FIG. 4, a printed board assembly (PBA) 400 according to an embodiment may include a first printed circuit board (PCB) 411, a second PCB 412 including a conductive area 430, multiple conductive vias 460, and an interposer 420. According to another embodiment (not shown), a part (e.g., multiple conductive vias 460) of aforementioned composition may be omitted and another composition may be added.

According to an embodiment of the disclosure, the PBA 400 may include a first PCB 411 and a second PCB 412 disposed to substantially parallel to the first PCB 411. According to an embodiment of the disclosure, the PBA 400 may include an interposer 420 surrounding a space between the first PCB 411 and the second PCB 412. According to an embodiment of the disclosure, the first PCB 411 and the second PCB 412 may be connected to each other through the interposer 420. For example, the first PCB 411 and the second PCB 412 may be connected to each other through multiple conductive vias 460 included in the interposer 420. According to an embodiment of the disclosure, a first ground 4111 of the first PCB 411 and a second ground 4122 of the second PCB 412 may be electrically connected through the multiple conductive vias 460 included in the interposer 420 and/or a lateral plating (e.g., gold (Au)).

According to an embodiment of the disclosure, the first PCB 411 and the second PCB 412 may be fixed by the interposer 420. According to an embodiment of the disclosure, the first PCB 411 and the second PCB 412 may be coupled to the interposer 420 to form a stacked structure. According to an embodiment of the disclosure, at least one electronic component may be disposed on the first PCB 411 and/or the second PCB 412. The detailed description thereof will be given below.

According to an embodiment of the disclosure, the interposer 420 may include a first partition wall structure 421 and/or a second partition wall structure 422. In an embodiment of the disclosure, the first partition wall structure 421 may include a conductive partition wall structure. For example, the conductive partition wall structure may include the multiple conductive vias 460 and a plating and thus provide an electrical shielding. For example, at least part of the multiple conductive vias 460 may electrically connect the first ground 4111 of the first PCB 411 and the second ground 4122 of the second PCB 412. According to an embodiment of the disclosure, the first partition structure 421 of the interposer 420 may provide a shielding for at least one electronic component disposed in a space formed by the first PCB 411 and the second PCB 412. According to an embodiment of the disclosure, the interposer 420 may include a second partition wall structure 422 connected to a first partition wall structure 421. According to an embodiment of the disclosure, the first partition wall structure 421 and/or the second partition wall structure 422 may include a dielectric material. For example, the second partition wall structure 421 may not include a conductive partition wall structure. According to an embodiment of the disclosure, the interposer 420 may form a closed loop through the first partition wall structure 421 and the second partition wall structure 422. In another embodiment of the disclosure, the second partition wall structure 422 of the interposer 420 may be omitted. For example, the interposer 420 may form a U-shape through the first partition wall structure 421.

According to an embodiment of the disclosure, the PBA 400 may include an electromagnetically open area on at least a part thereof. For example, the second partition structure 421 of the interposer 420 included in the PBA 400 may include an electromagnetically open area. For another example, when the second partition wall structure 422 of the interposer 420 is omitted, the PBA 400 may include an opening.

According to an embodiment of the disclosure, the second partition wall structure 422 may include at least one conductive via 470. According to an embodiment of the disclosure, the second partition wall structure 422 may include at least one conductive 470 at a first point of the second partition wall structure 422. According to an embodiment of the disclosure, a power feeding line 40 disposed on the first PCB 411 and electrically connected to a wireless communication circuit may be electrically connected to the second ground 4122 of the second PCB 412 through the at least one via 470 disposed at the first point.

According to an embodiment of the disclosure, the second ground 4122 of the second PCB 412 may be electrically connected to the wireless communication circuit through a conductive connection member (not shown) disposed in a space between the first PCB 411 and the second PCB 412. In this case, the conductive via 470 may be omitted. For example, the conductive connection member may include a C-clip or a pogo-pin.

According to an embodiment of the disclosure, the first ground 4111 of the first PCB 411, the second ground 4122 of the second PCB 412, or the interposer 420 may form one cavity, and may form a cavity antenna using the cavity through an electrical connection of the first ground 4111 or the second ground 4122 with the wireless communication circuit.

According to an embodiment of the disclosure, the PCB 400 may include a wireless communication circuit (not shown). According to an embodiment of the disclosure, the wireless communication circuit may feed power to the first PCB 411 and/or the second PCB 412 through the at least one conductive via 470 or the conductive connection member. For example, the wireless communication circuit may feed power to the first PCB 411 and the second PCB 412 through the at least one conductive via 470 to transmit or receive a signal in a first frequency band (e.g.: about 5500 MHZ). In another embodiment of the disclosure, the wireless communication circuit may be disposed outside the PBA 400. In this case, the electronic device (e.g.: electronic device 300 of FIG. 3) may include an electrical path for feeding power to a point (e.g.: conductive via 470) of the PBA 400 by the wireless communication circuit.

According to an embodiment of the disclosure, the power feeding line 40 electrically connected to the wireless communication circuit may be electrically connected a father one of the first ground 4111 or the second ground 4122 from the power feeding line 40 and may not be electrically connected to a closer one thereof. For example, when the power feeding line 40 is disposed on the first PCB 411, the power feeding line 40 may be electrically connected to the second ground 4122 positioned on the second PCB 412 and may not be electrically connected to the first ground 4111 of the first PCB 411. For another example, the power feeding line 40 may not be disposed between the first ground 4111 of the first PCB 411 and the second ground 4122 of the second PCB 412.

Figure 5:
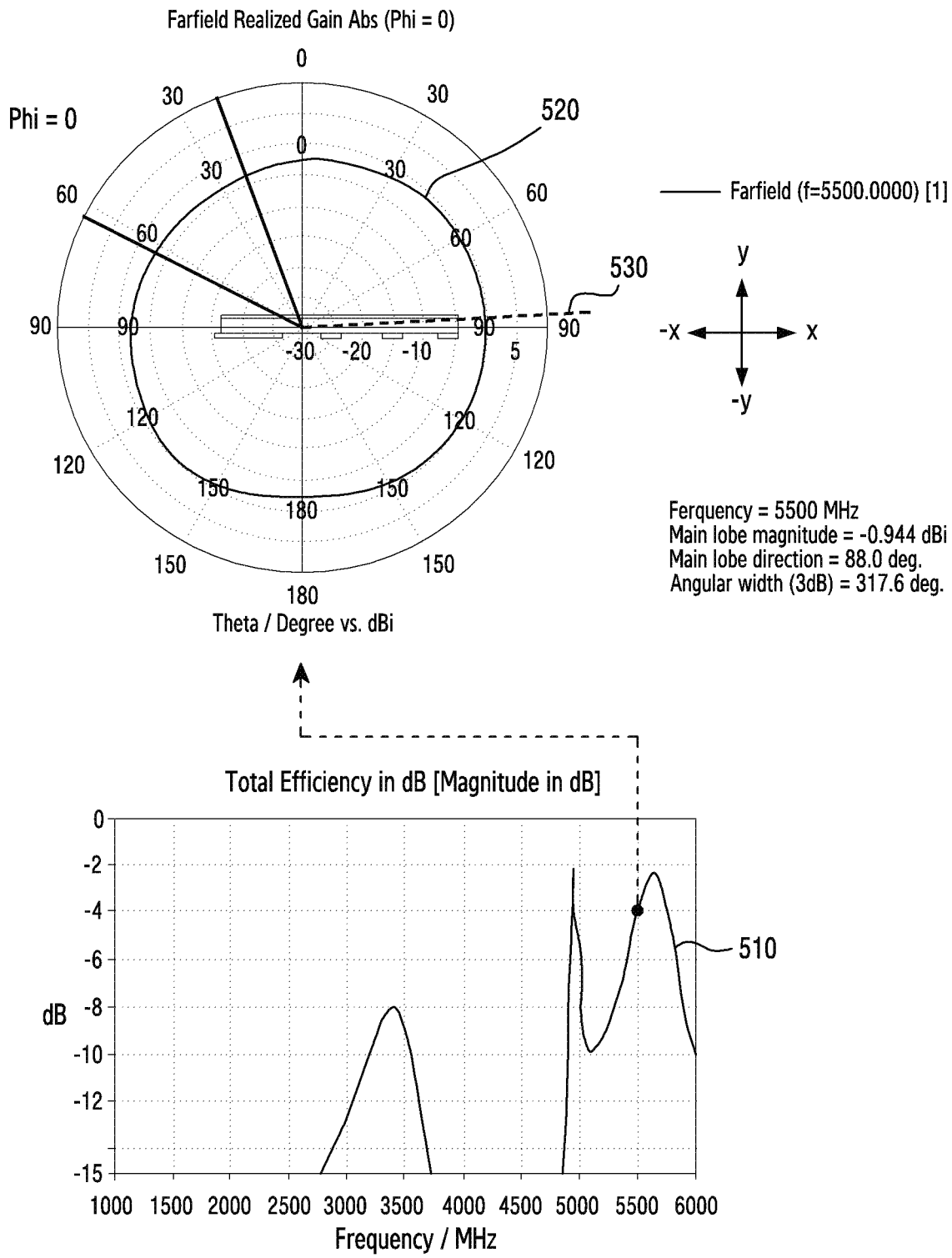
FIG. 5 shows a radiation efficiency and a radiation pattern of an antenna using a PBA of FIG. 4 according to an embodiment of the disclosure.

FIG. 5 shows a radiation efficiency and a radiation pattern of an antenna using a PBA of FIG. 4 according to an embodiment of the disclosure.

Referring to FIGS. 4 and 5 together, the wireless communication circuit according to an embodiment may feed power to the PBA 400 through the at least one conductive via 470 included in the second partition wall structure 422 to transmit or receive a signal in a specified frequency band (e.g.: about 5500 MHZ).

Referring to FIG. 5, a radiation efficiency and a radiation pattern in a state in which the PBA 400 is disposed in the air or a space without a structure causing an interference to the PBA 400 not in the electronic device (e.g.: electronic device 300 of FIG. 3) are shown.

According to an embodiment of the disclosure, the wireless communication circuit may transmit and/or receive a signal having a first radiation efficiency 510 by feeding power to the PBA 400. For example, the signal transmitted and/or received through the PBA 400 may have a radiation efficiency of about −2 db in a frequency band of about 5000 MHz to about 6000 MHz.

According to an embodiment of the disclosure, the wireless communication circuit may transmit and/or receive a signal in a first direction 530 (e.g.: +x direction) though the PBA 400, but the direction is not limited thereto. According to an embodiment of the disclosure, the signal radiated through the PBA 400 is not limited to the first direction 530 and may be radiated to the front surface or the rear surface of the PBA 400. For example, a cross-sectional radiation pattern 520 may have a circular shape.

Figure 6A:
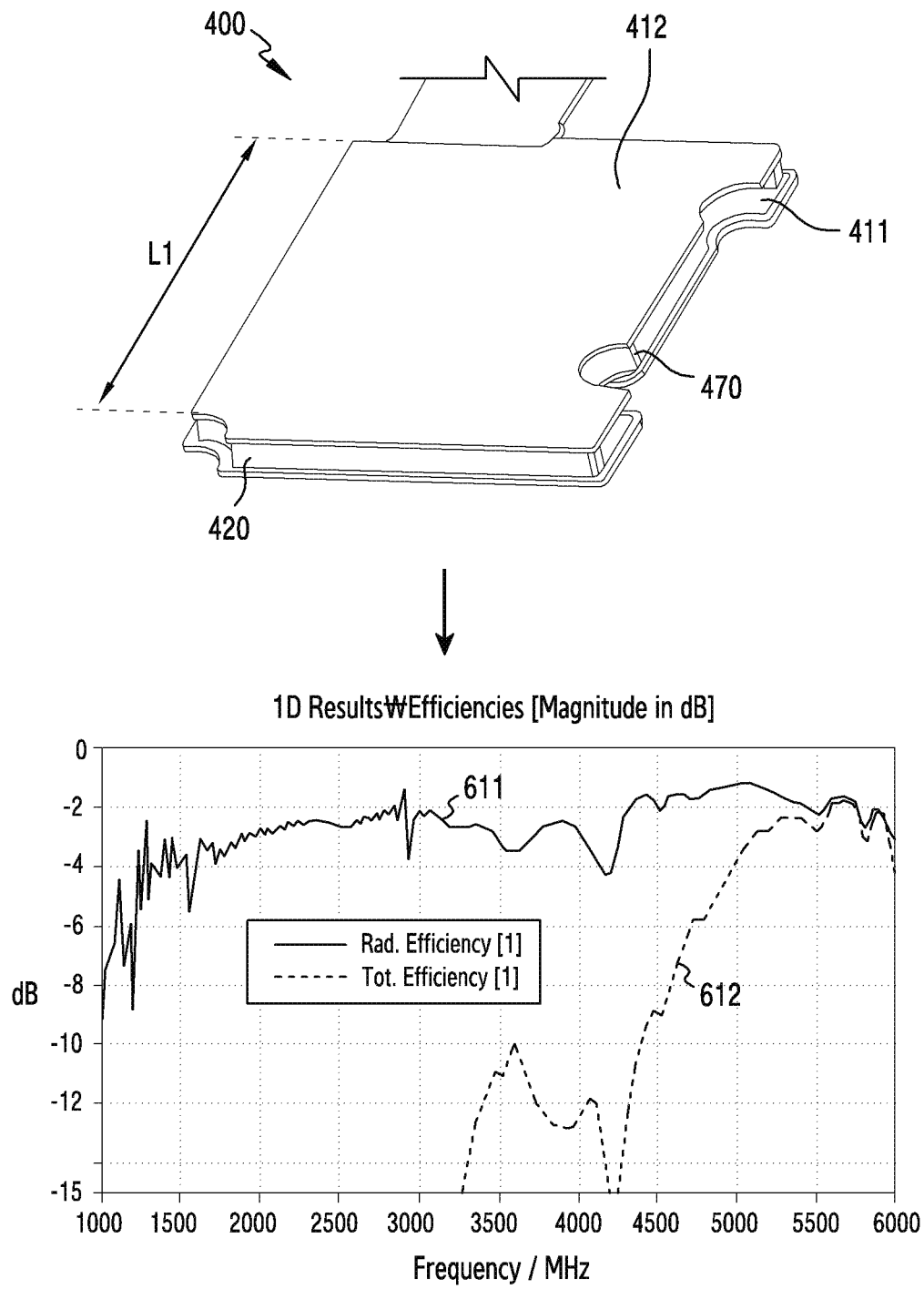
FIG. 6A shows a PBA having a first width and a radiation efficiency of the PBA according to an embodiment of the disclosure.

FIG. 6A shows a PBA having a first width and radiation efficiency of the PBA according to an embodiment of the disclosure.

Figure 6B:
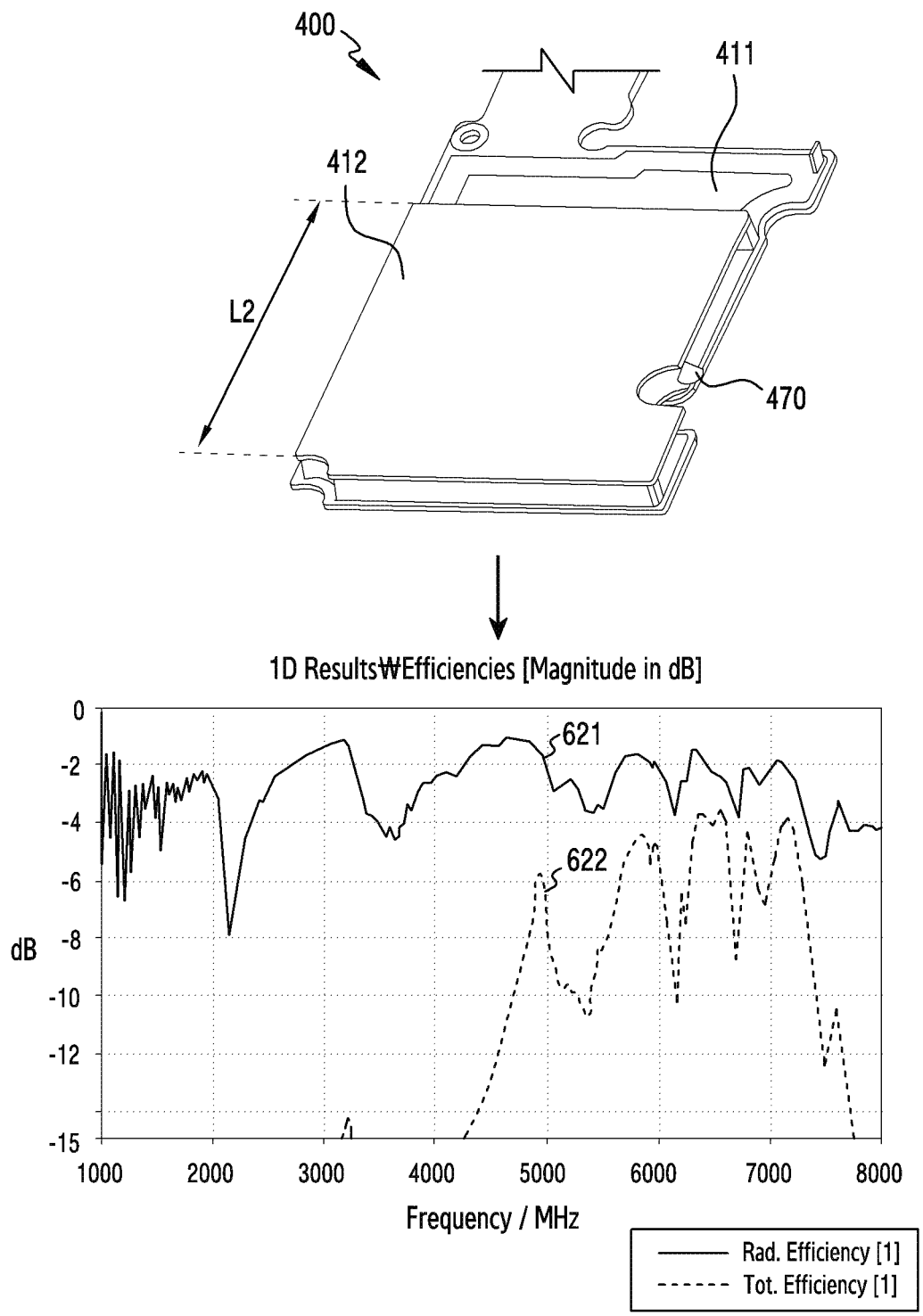
FIG. 6B shows a PBA having a second width and radiation efficiency of the PBA according to an embodiment of the disclosure.

FIG. 6B shows a PBA having a second width and radiation efficiency of the PBA according to an embodiment of the disclosure.

Referring to FIGS. 6A and 6B together, an interposer 420 of the PBA 400 according to an embodiment of the disclosure may have various widths (L1 or L2). According to an embodiment of the disclosure, a volume of a space between the first PCB 411 and the second PCB 412 surrounded by the interposer 420 may be changed according to the width of the interposer 420. According to an embodiment of the disclosure, an antenna disposed in the PBA 400 may include various radiation efficiencies 611, 612, 621, and 622 according to the width of the interposer 420. For example, a resonant frequency of an antenna formed by using the first PCB 411, the second PCB 412, or the interposer 420 of the PBA 400 may be changed according to a size of a space formed by the first PCB 411, the second PCB 412, or the interposer 420.

According to an embodiment of the disclosure, the interposer 420 may have a first width L1 or a second width L2 smaller than the first width L1. According to an embodiment of the disclosure, when the interposer 420 has the first width L1, the radiation by the antenna disposed on the PBA 400 may include a first radiation efficiency 611 and a first total efficiency 612. For example, when the interposer 420 has the first width L1, the antenna disposed on the PBA 400 may operate in a first frequency band (e.g.: about 5500 MHz to about 6000 MHz).

According to an embodiment of the disclosure, when the interposer 420 has the second width L2 smaller than the first width L1, the radiation by the antenna disposed on the PBA 400 may include a second radiation efficiency 621 and a first total efficiency 622. For example, when the interposer 420 has the second width L2 smaller than the first width L1, the antenna disposed on the PBA 400 may operate in a second frequency band (e.g.: about 6000 MHz to about 7200 MHz).

According to an embodiment of the disclosure, when the width of the interposer 420 decreases, a volume of a space formed by the first PCB 411, the second PCB 412, and the interposer 420 may decrease. According to an embodiment of the disclosure, when the volume of a space formed by the first PCB 411, the second PCB 412, and the interposer 420 decreases, an antenna formed by using the first PCB 411, the second PCB 412, and the interposer 420 may operate in a higher frequency band. For example, the width of the interposer 420 decreases from the first width L1 to the second width L2, a frequency band having a maximum efficiency may increase from about 5500 MHz to about 6500 MHz.

Figure 7A:
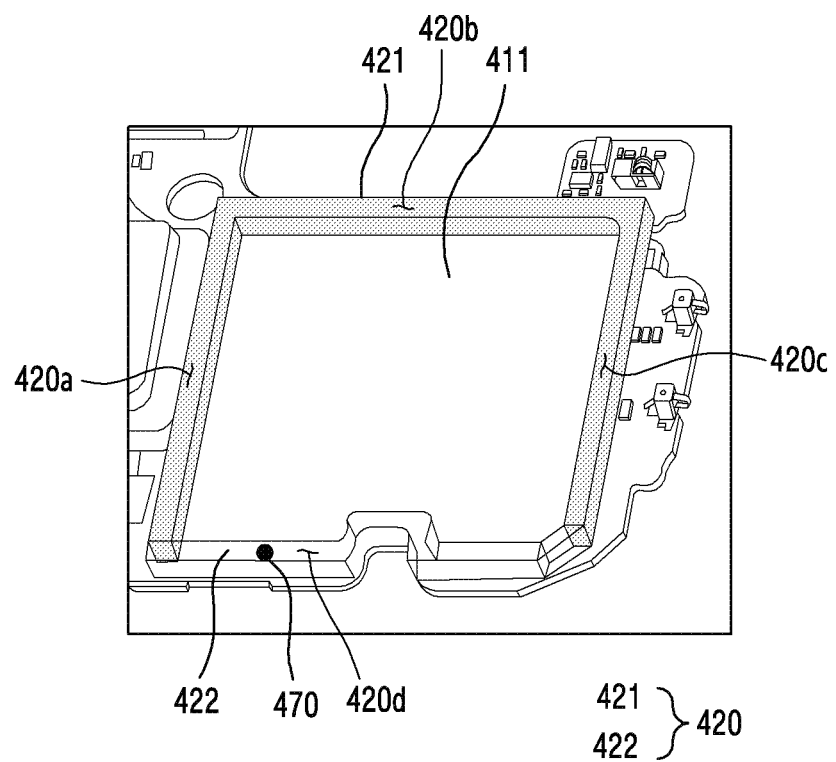
FIG. 7A is a perspective view illustrating a PBA including a first partition wall structure and a second partition wall structure according to an embodiment of the disclosure.

FIG. 7A is a perspective view illustrating a PBA including a first partition wall structure and a second partition wall structure according to an embodiment of the disclosure.

Figure 7B:
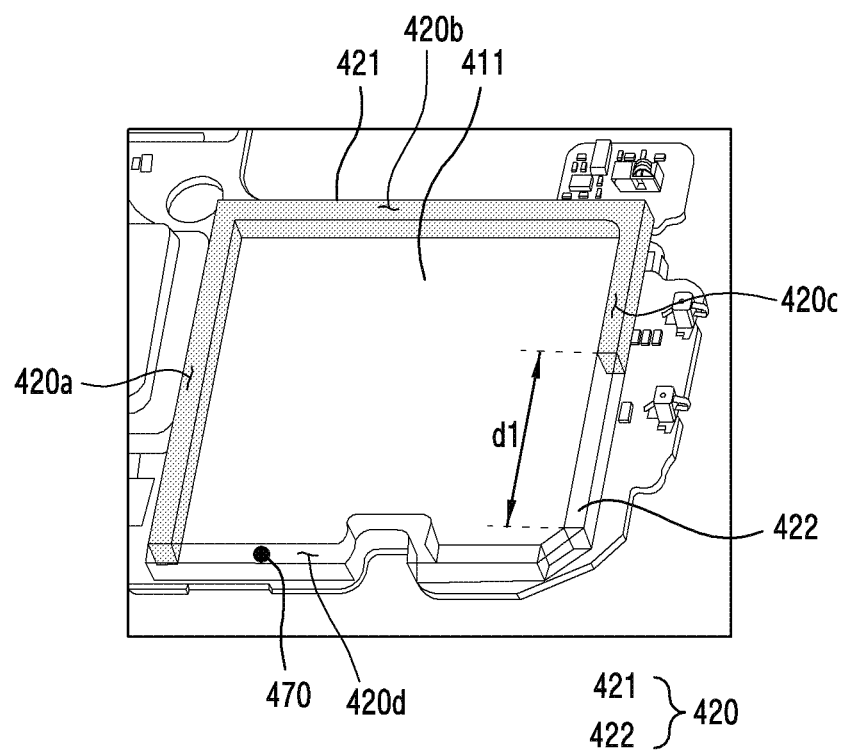
FIG. 7B is a perspective view illustrating a PBA having a second partition wall structure of FIG. 7A extending by a first length according to an embodiment of the disclosure.

FIG. 7B is a perspective view illustrating a PBA having a second partition wall structure of FIG. 7A extending by a first length according to an embodiment of the disclosure.

Figure 7C:
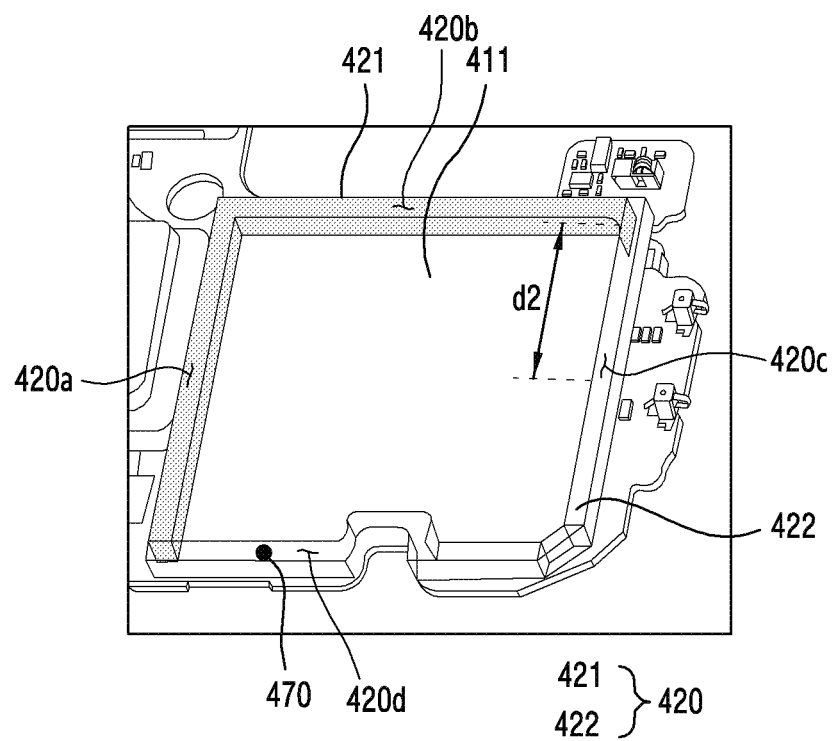
FIG. 7C is a perspective view illustrating a PBA having a second partition wall structure of FIG. 7B extending by a second length according to an embodiment of the disclosure.

FIG. 7C is a perspective view illustrating a PBA having a second partition wall structure of FIG. 7B extending by a second length according to an embodiment of the disclosure.

Figure 7D:
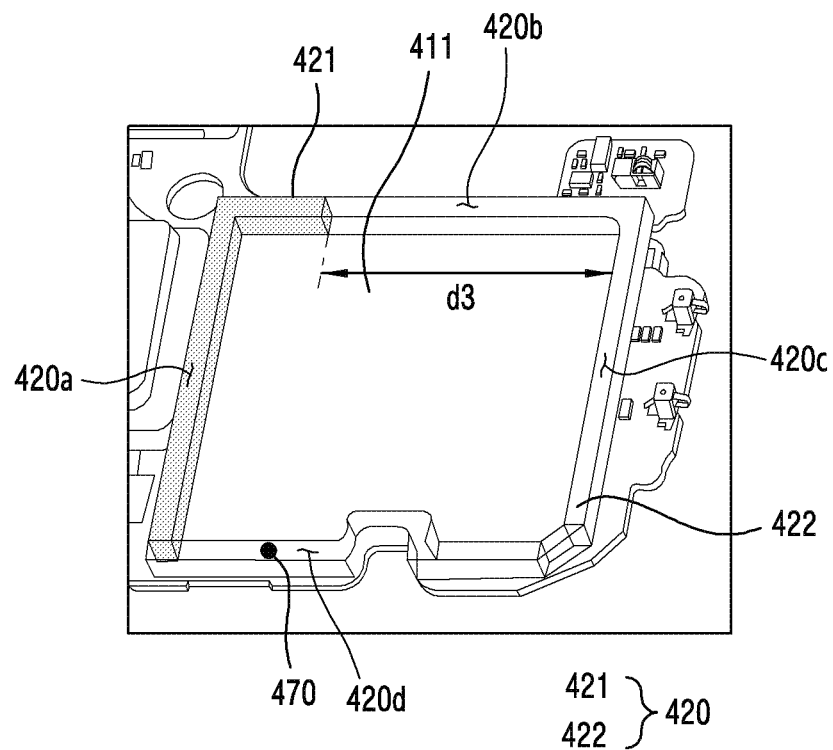
FIG. 7D is a perspective view illustrating a PBA having a second partition wall structure of FIG. 7C extending by a third length according to an embodiment of the disclosure.

FIG. 7D is a perspective view illustrating a PBA having a second partition wall structure of FIG. 7C extending by a third length according to an embodiment of the disclosure.

Figure 7E:
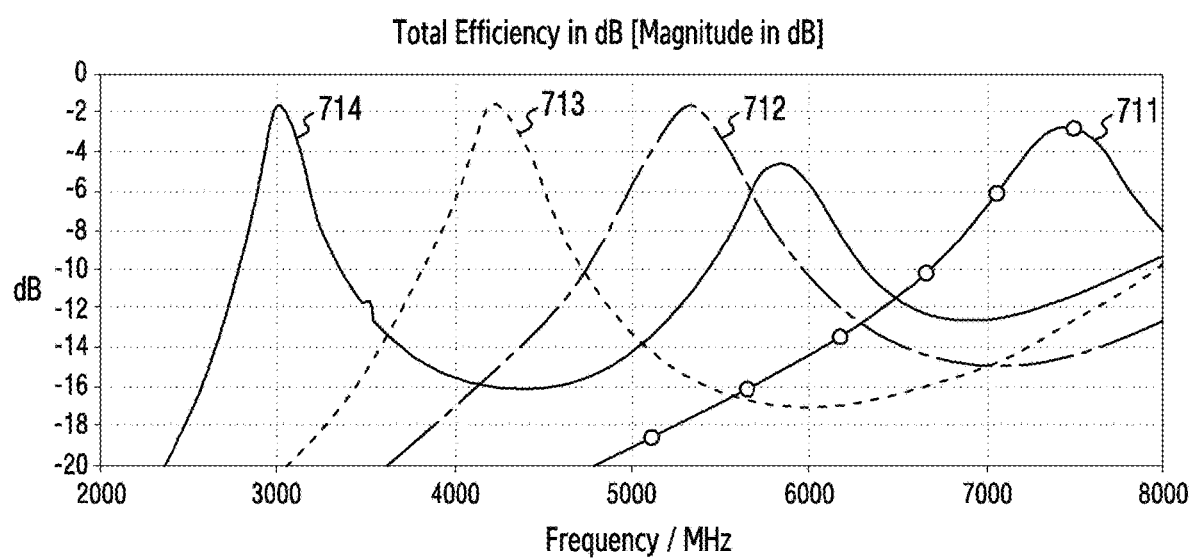
FIG. 7E shows a radiation efficiency using a PBA of FIGS. 7A to 7D according to an embodiment of the disclosure.

FIG. 7E shows radiation efficiency of an antenna using a PBA of FIGS. 7A to 7D according to an embodiment of the disclosure.

Referring to FIGS. 7A to 7E together, the interposer 420 may include the second partition wall structure 422 having various lengths and the first partition wall structure 421 extending from the second partition wall structure 422 to form a closed loop. According to an embodiment of the disclosure, the interposer 420 may be disposed on a surface of the first PCB 411. According to an embodiment of the disclosure, the first partition wall structure 421 may include multiple conductive vias (e.g.: multiple conductive vias 460 of FIG. 4). According to an embodiment of the disclosure, the interposer 420 may include at least one via 470 in the second partition wall structure 422. According to an embodiment of the disclosure, the first partition wall structure 421 may provide a shielding of radio wave or noise and the second partition wall structure 422 may operate as an RF window for radiating radio wave. According to an embodiment of the disclosure, the interposer 420 may include a first edge 420a, a second edge 420b substantially perpendicularly extending from the first edge 420a, a third edge 420c substantially perpendicularly extending from the second edge 420b and substantially parallel to the first edge 420a, and a fourth edge 420d substantially perpendicularly extending from the first edge 420a and the third edge 420c.

According to an embodiment of the disclosure, an operational frequency band 711-714 of the antenna formed by the PBA 400 may be changed based on a size of the first partition wall structure 421 or the second partition wall structure 422 included in the interposer 420. According to an embodiment of the disclosure, when a proportion of a part formed by the second partition wall structure 422 in the interposer 420 increases, as shown in FIG. 7E, a frequency band having a maximum efficiency of a signal radiated by the antenna formed by the PBA 400 may be lowered. For example, when a proportion of a part formed by the second partition wall structure 422 in the interposer 420 increases, an operational frequency band of the antenna formed by the PBA 400 may be lowered.

According to an embodiment of the disclosure, the interposer 420 may include the first partition wall structure 421 forming the first edge 420a, the second edge 420b, and the third edge 420c, and the second partition wall structure 422 forming the fourth edge 420d. In this case, a signal radiated from the antenna formed through the PBA 400 may be radiated at a maximum efficiency of about 7500 MHz. For another example, when the second partition wall structure 422 extends by a first length d1 along the third edge 420c, a signal radiated from the antenna formed through the PBA 400 may be radiated at a maximum efficiency of about 5200 MHZ. For another example, when the second partition wall structure 422 extends by a second length d2 along the third edge 420c to form the fourth edge 420d and the third edge 420c, a signal radiated from the antenna formed through the PBA 400 may be radiated at a maximum efficiency of about 4200 MHz. For another example, when the second partition wall structure 422 extends by a third length d3 along the second edge 420b to form a part of the fourth edge 420d, the third edge 420c, and second edge 420b, a signal radiated from the antenna formed through the PBA 400 may be radiated at a maximum efficiency of about 3000 MHz.

Figure 8A:
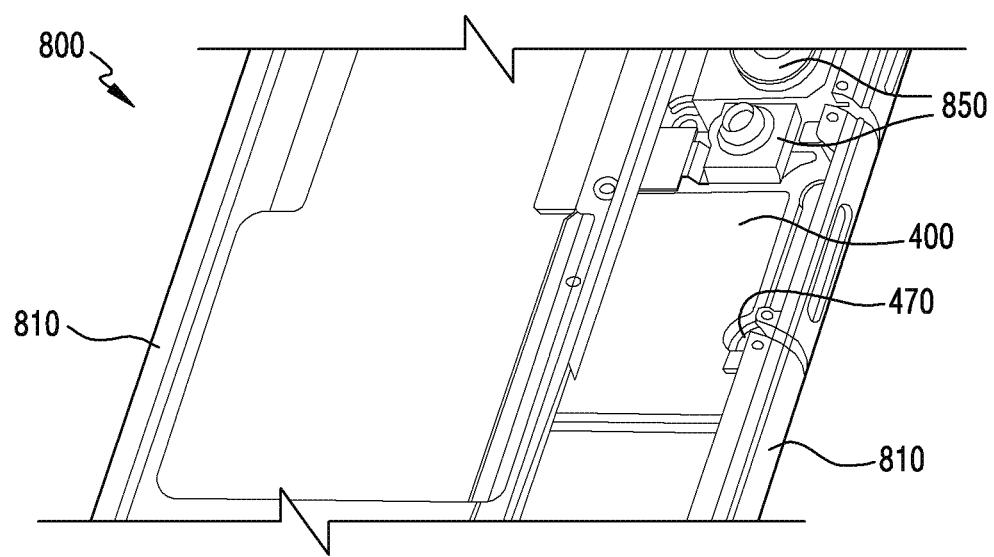
FIG. 8A is a perspective view illustrating a rear surface of an electronic device in which a PBA is mounted according to an embodiment of the disclosure.

FIG. 8A is a perspective view illustrating a rear surface of an electronic device in which a PBA is mounted according to an embodiment of the disclosure.

Figure 8B:
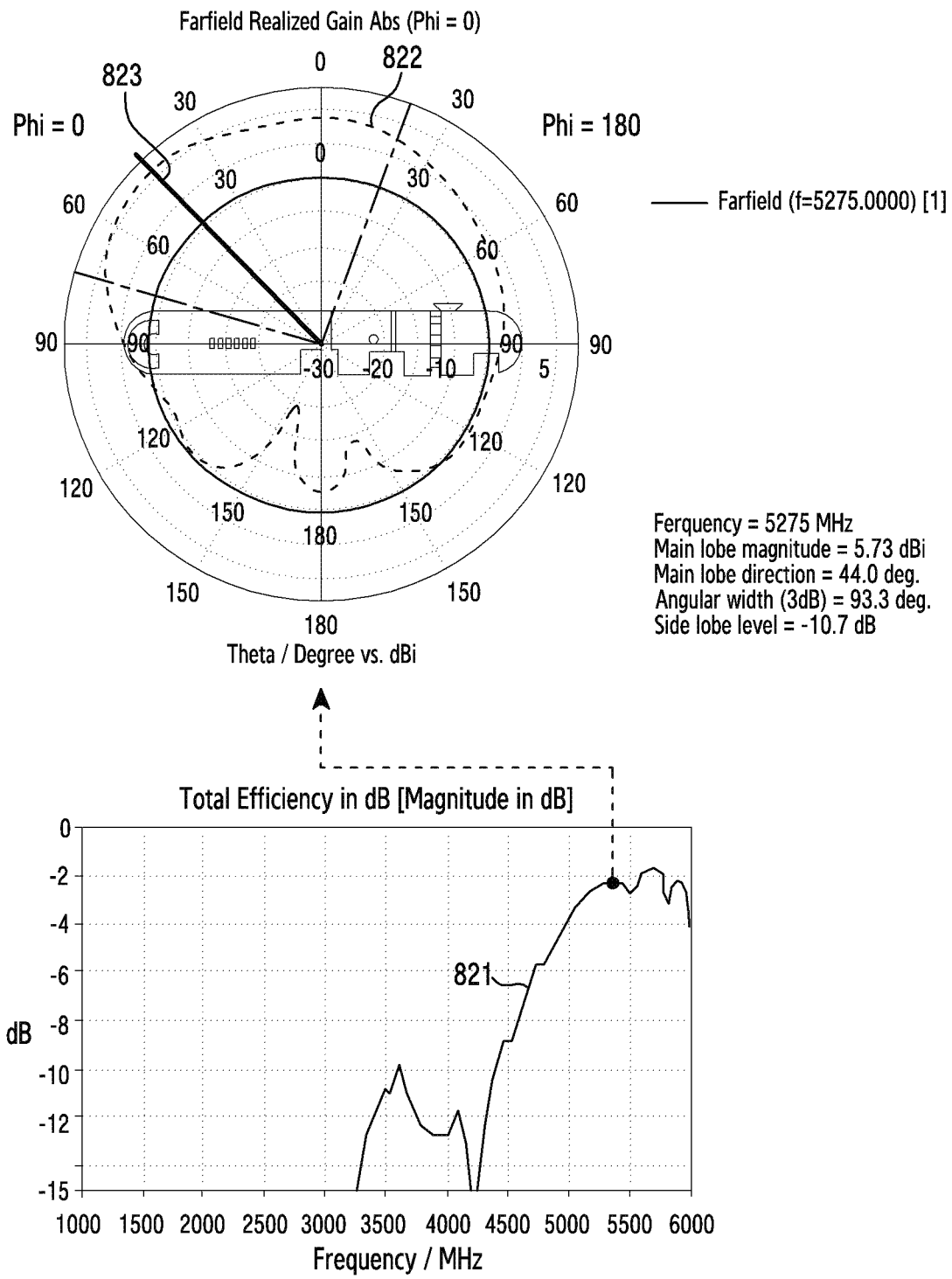
FIG. 8B shows a radiation efficiency and a radiation pattern using a PBA of FIG. 8A according to an embodiment of the disclosure.

FIG. 8B shows a radiation efficiency and a radiation pattern using the PBA of FIG. 8A according to an embodiment of the disclosure.

Referring to FIG. 8A, an electronic device 800 according to an embodiment may include a camera structure 850 (e.g.: a camera module 2080 in FIG. 20), a lateral housing 810 (e.g.: lateral bezel structure 310 of FIG. 3), and a PBA 400. According to an embodiment of the disclosure, the lateral housing 810 may include a metal, but is not limited thereto. In connection with the aforementioned description, like or similar reference numerals may be used for like or similar elements and an overlapping description thereof will be omitted.

According to an embodiment of the disclosure, the PBA 400 may be disposed adjacent to the camera structure 850 in the electronic device 800. According to an embodiment of the disclosure, the PBA 400 may be disposed adjacent to the lateral housing 810. According to an embodiment of the disclosure, the PBA 400 may be disposed adjacent to the camera structure 850 and the lateral housing 810.

Referring to FIGS. 8A and 8B together, the wireless communication circuit (not shown) according to an embodiment may transmit and/or receive a signal by feeding power to the PBA 400 through a conductive via 470. According to an embodiment of the disclosure, a signal radiated from an antenna formed through the PBA 400 may include a first radiation efficiency 821 having a maximum efficiency at a first frequency band (e.g.: about 5500 MHZ).

According to an embodiment of the disclosure, when the lateral housing 810 facing the second partition wall structure 422 of the interposer 420 included in PBA 400 includes a metal material, a signal radiated from the antenna formed through the PBA 400 may include a cross-sectional radiation pattern 822 having a maximum radiation through a first direction 823, but the radiation direction of the cross-sectional radiation pattern 822 is not limited thereto.

Figure 9A:
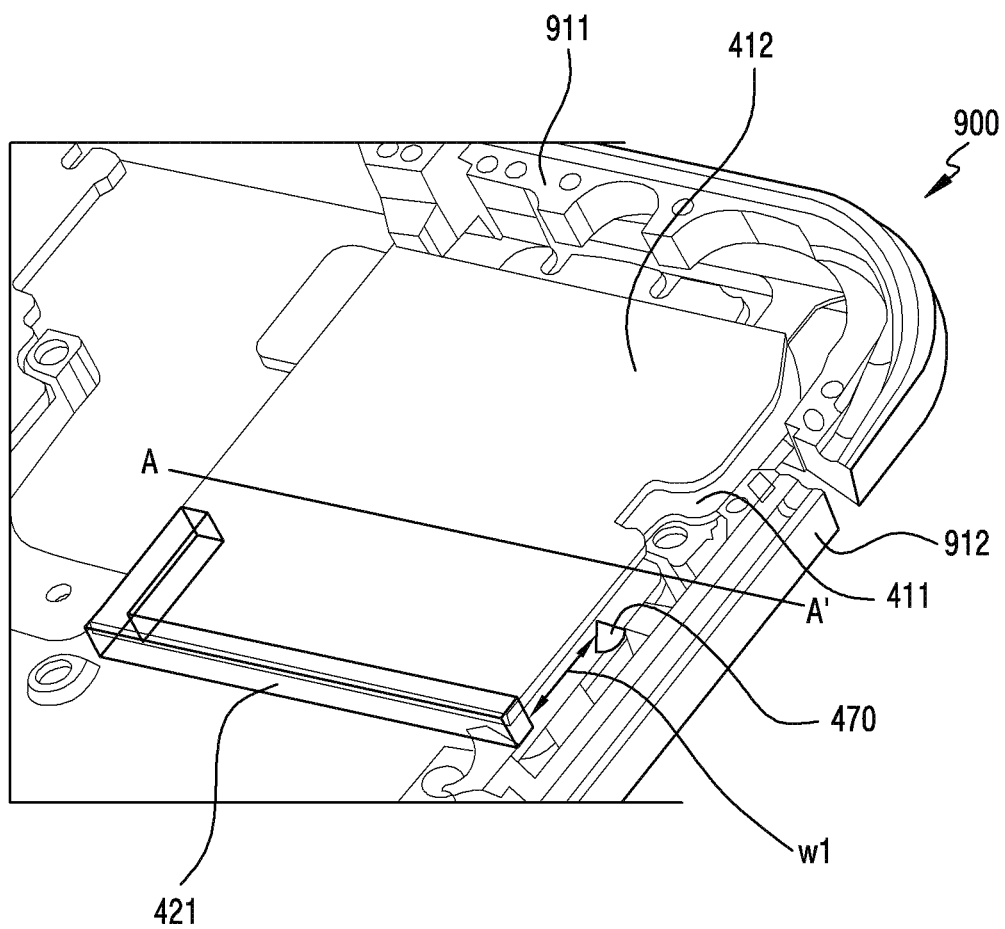
FIG. 9A shows a mounting structure of a PBA, in which a conductive via is position at a first point according to an embodiment of the disclosure.
Figure 9B:
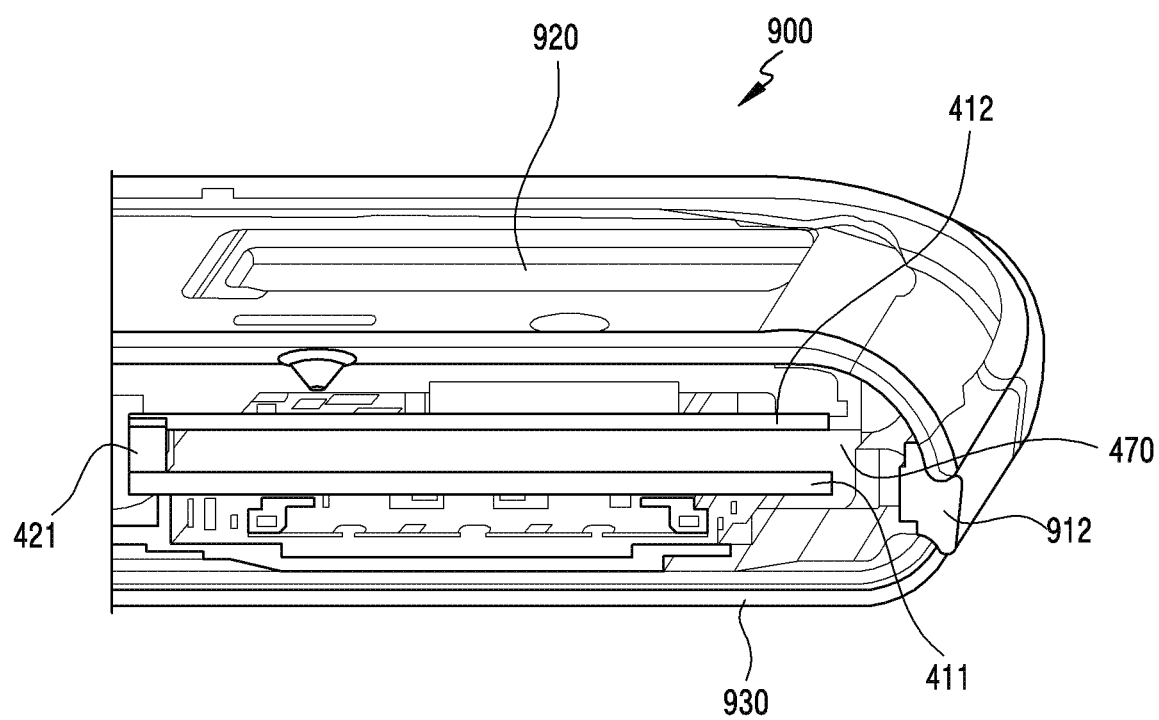
FIG. 9B is a cross-sectional view taken along A-A' of a PBA shown in FIG. 9A according to an embodiment of the disclosure.
Figure 9C:
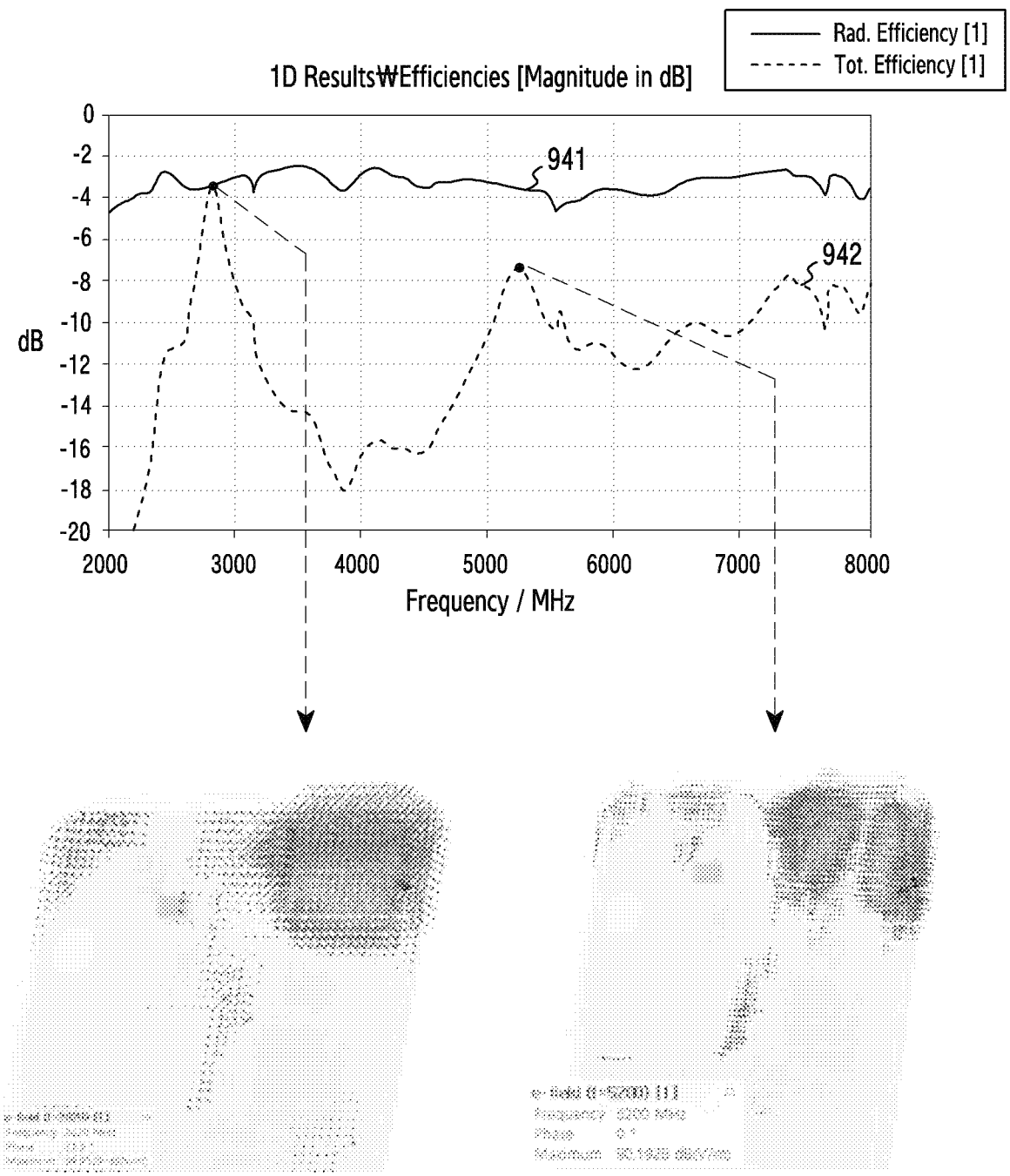
FIG. 9C shows a radiation efficiency and a radiation pattern using a PBA of FIG. 9A according to an embodiment of the disclosure.

FIG. 9A shows a mounting structure of a PBA, in which a conductive via is position at a first point according to an embodiment of the disclosure. FIG. 9B is a cross-sectional view taken along A-A' of the PBA shown in FIG. 9A according to an embodiment of the disclosure. FIG. 9C shows a radiation efficiency and a radiation pattern using the PBA of FIG. 9A according to an embodiment of the disclosure.

Referring to FIGS. 9A and 9B together, an electronic device 900 may include a PBA 400, a first lateral housing 911, a second lateral housing 912, and a rear cover 930 (e.g.: rear plate 111 of FIG. 1). For example, the first lateral housing 911 and the second lateral housing 912 may be included in a lateral housing (lateral housing 810 of FIG. 8A). In connection with the aforementioned description, like or similar reference numerals may be used for like or similar elements and an overlapping description thereof will be omitted.

According to an embodiment of the disclosure, the first lateral housing 911 and the second lateral housing 912 may be arranged to surround a part of a space between a front display 920 (e.g.: display 330 of FIG. 3) and a rear cover 930. According to another embodiment (not shown), the first lateral housing 911 and the second lateral housing 912 may be integrally formed. According to an embodiment of the disclosure, the first lateral housing 911 and the second lateral housing 912 may include a metal, but is not limited thereto. According to an embodiment of the disclosure, the lateral housing including the first lateral housing 911 and the second lateral housing 912, and the rear cover 930 may be integrally formed.

According to an embodiment of the disclosure, the PBA 400 may be disposed adjacent to the first lateral housing 911 and the second lateral housing 912 in the electronic device 900. According to an embodiment of the disclosure, the PBA 400 may be disposed in a space surrounded by the front display 920, a second lateral housing 912, and the rear cover 930.

According to an embodiment of the disclosure, the PBA 400 may include an interposer (e.g.: interposer 420 of FIG. 4) including a first PCB 411, a second PCB 412, a conductive via 470, and/or a first partition wall structure 421. According to an embodiment of the disclosure, the conductive via 470 may be electrically connected to a second ground 4122 of the second PCB 412. According to an embodiment of the disclosure, at least a part of the multiple conductive vias 460 included in the first partition wall structure 421 may electrically connect a first ground 4111 of the first PCB 411 and the second ground 4122 of the second PCB 412. According to an embodiment of the disclosure, the conductive via 470 may be disposed at a first point spaced apart from the first partition wall structure 421 by a first distance w1. According to an embodiment of the disclosure, the conductive via 470 may be disposed at an edge of the first PCB 411 and/or the second PCB 412 or adjacent to the edge, but is not limited thereto.

Referring to FIGS. 9A and 9B together, a wireless communication circuit according to an embodiment may feed power to the second ground 4122 of the second PCB 412 by using the conductive via 470 of the PBA 400 to perform radiation at a maximum efficiency in a specified frequency band. According to an embodiment of the disclosure, a signal radiated from an antenna formed through the PBA 400 may include a first radiation efficiency 941 and a first total efficiency 942. For example, the first total efficiency 942 may include a maximum efficiency in the first frequency band (e.g.: about 2820 MHz or about 5200 MHz).

Figure 10A:
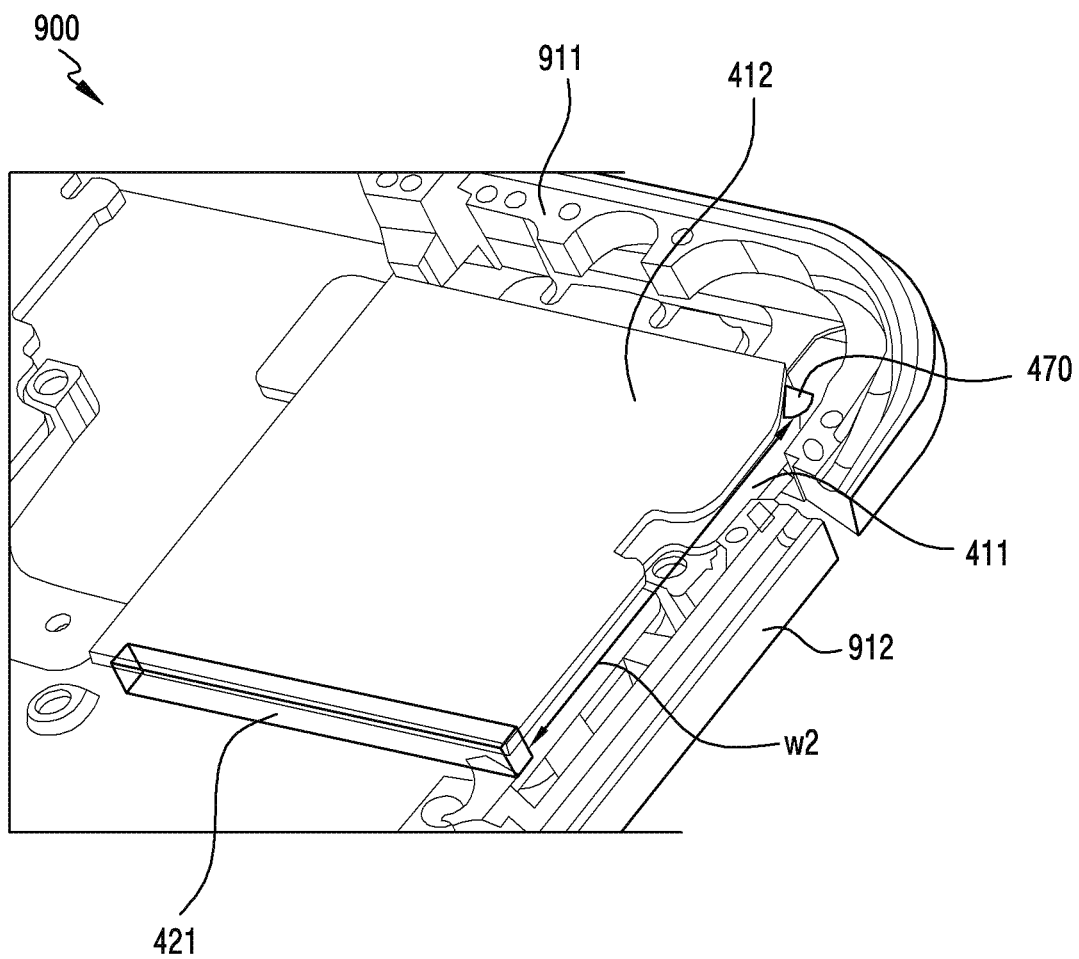
FIG. 10A shows a mounting structure of a PBA, in which a conductive via is position at a second point according to an embodiment of the disclosure.

FIG. 10A shows a mounting structure of a PBA, in which a conductive via is position at a second point according to an embodiment of the disclosure.

Figure 10B:
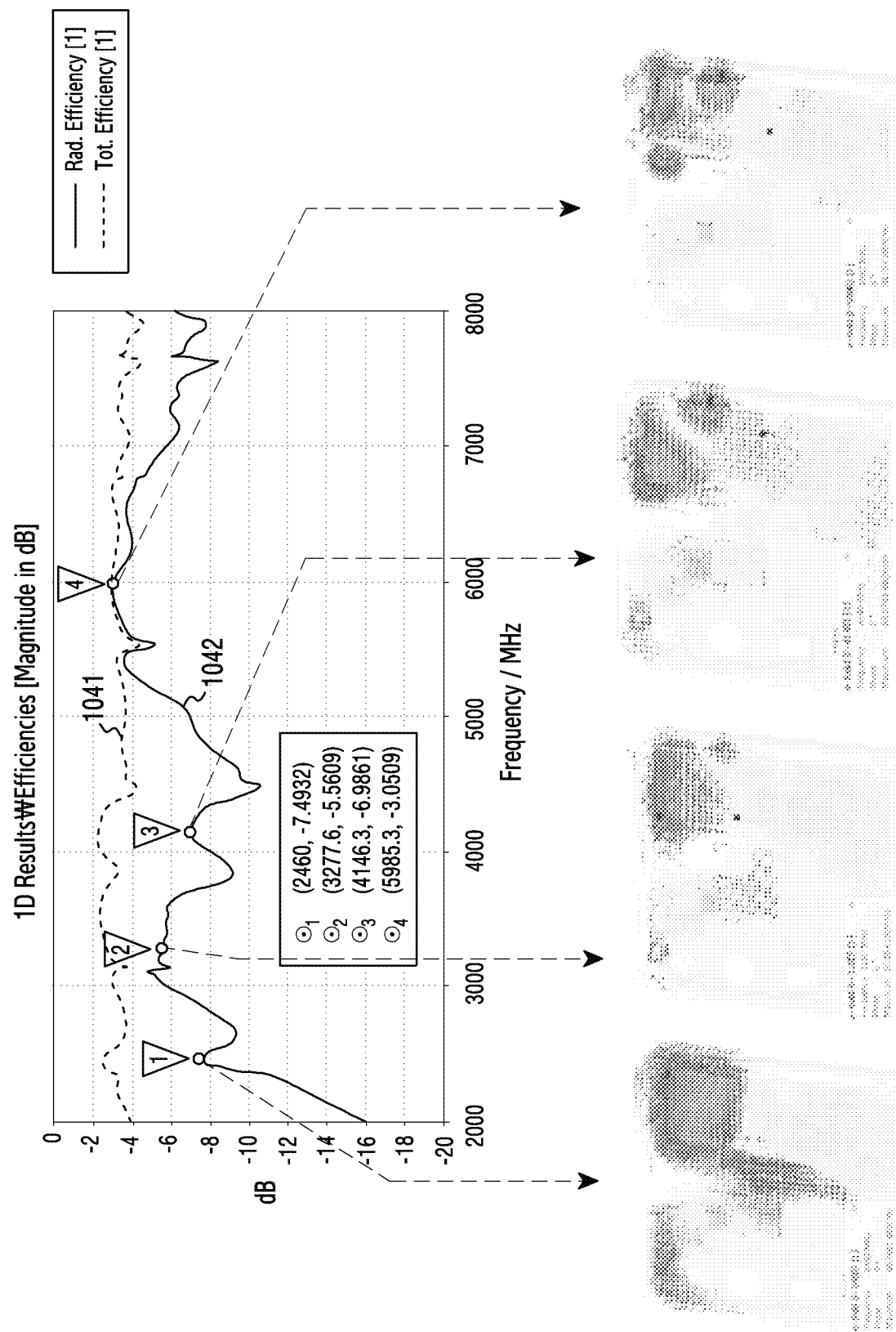
FIG. 10B shows a radiation efficiency and a radiation pattern using a PBA of FIG. 10A according to an embodiment of the disclosure.

FIG. 10B shows a radiation efficiency and a radiation pattern of an antenna using the PBA of FIG. 10A according to an embodiment of the disclosure.

Referring to FIG. 10A, an electronic device 900 may include a PBA 400, a first lateral housing 911 and a second lateral housing 912 (e.g.: lateral housing 810 of FIG. 8A). In connection with the aforementioned description, like or similar reference numerals may be used for like or similar elements and an overlapping description thereof will be omitted.

According to an embodiment of the disclosure, the first lateral housing 911 and the second lateral housing 912 may be arranged to partially surround a space between the front display (e.g.: display 920 of FIG. 9B) and a rear cover (e.g.: 930 of FIG. 9B). According to another embodiment (not shown) of the disclosure, the first lateral housing 911 and the second lateral housing 912 may be integrally formed. According to an embodiment of the disclosure, an upper housing 911 and the lateral housing 912 may include a metal, but is not limited thereto. According to an embodiment of the disclosure, the lateral housing including the first lateral housing 911 and the second lateral housing 912, and the rear cover 930 may be integrally formed.

According to an embodiment of the disclosure, the PBA 400 may be disposed adjacent to the first lateral housing 911 and the second lateral housing 912 in the electronic device 900. For example, the locations of the PBA 400 of FIG. 10A and the PBA 400 of FIG. 9A may be substantially identical to each other.

According to an embodiment of the disclosure, the conductive via 470 may be connected to the wireless communication circuit and a second ground 4122 of the second PCB 412. For example, the wireless communication circuit may feed power to the second ground 4122 of the second PCB 412 by using the conductive via 470. According to an embodiment of the disclosure, the conductive via 470 may be disposed to be spaced apart from the first partition wall structure 421 by a second distance w2. According to an embodiment of the disclosure, the conductive via 470 may be disposed at an edge of the first PCB 411 and the second PCB 412 to be spaced apart from the first partition wall structure 421, but is not limited thereto.

Referring to FIGS. 10A and 10B together, a wireless communication circuit according to an embodiment may feed power to the second ground 4122 of the second PCB 412 by using the conductive via 470 to radiate a signal in a specified frequency band. According to an embodiment of the disclosure, a signal radiated from an antenna formed through the PBA 400 may include a first radiation efficiency 1041 and a first total efficiency 1042. For example, the wireless communication circuit may transmit and receive a signal in about 2460 MHz, about 3280 MHz, about 4140 MHZ, or about 5980 MHz by feeding power to an antenna formed in the PBA 400, but is not limited thereto.

According to an embodiment of the disclosure, the first partition wall structure 421 of FIG. 10A may have a length shorter than that of the first partition wall structure 421 of FIG. 9A, but is not limited thereto. Referring FIG. 10A, the antenna formed in the PBA 400 may perform as a broadband antenna for supporting multi frequency bands, based on the size of the first partition wall structure 421 and the location of the conductive via 470.

Figure 11A:
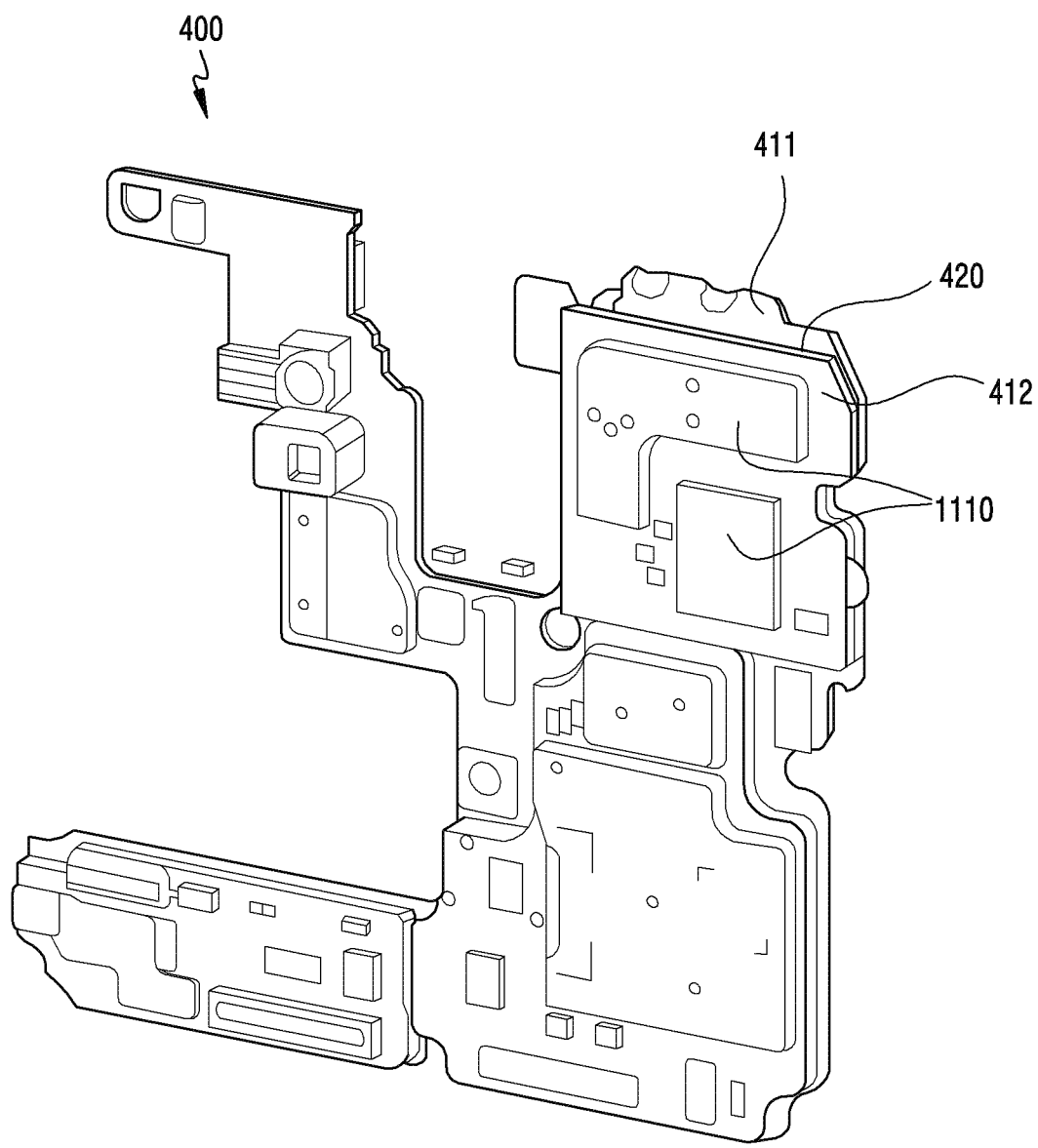
FIG. 11A shows a PBA in which at least one electronic component is mounted on a second PCB according to an embodiment of the disclosure.
Figure 11B:
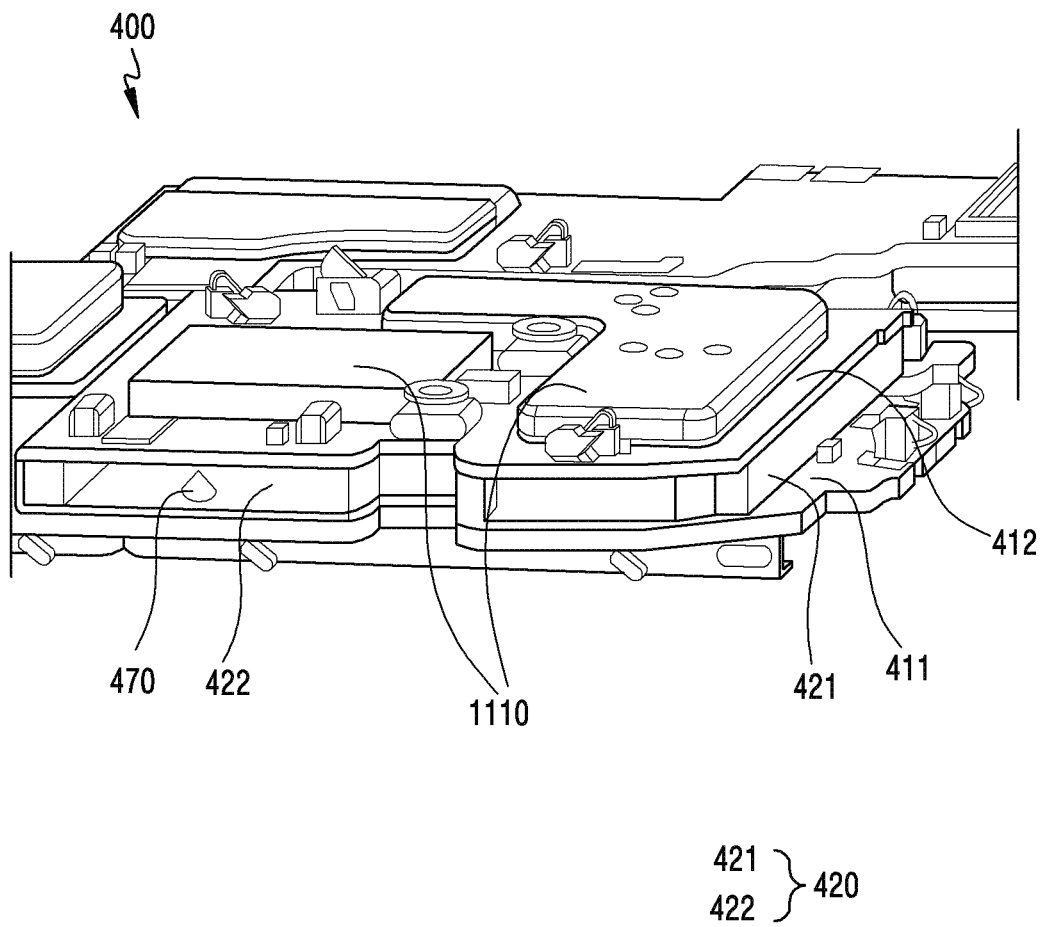
FIG. 11B is a lateral perspective view of a PBA of FIG. 11A according to an embodiment of the disclosure.
Figure 11C:
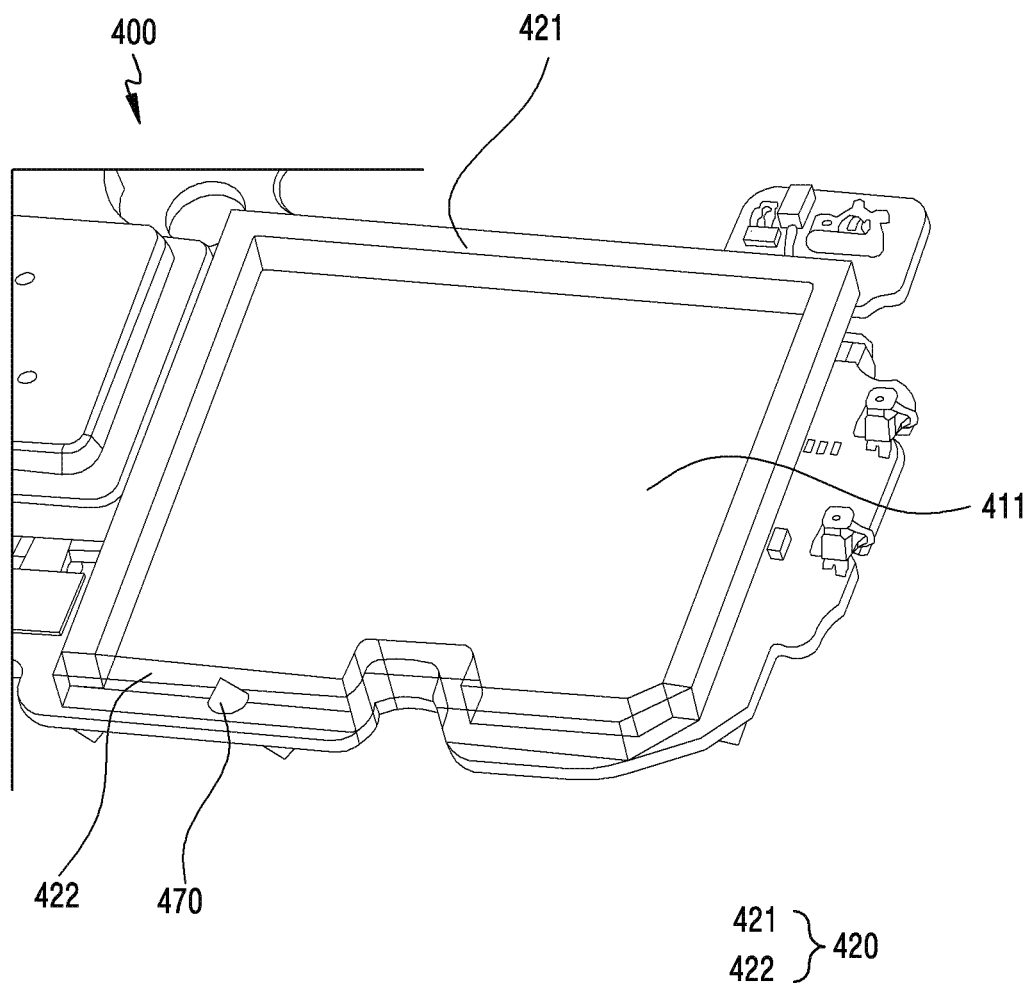
FIG. 11C shows a first PCB and an interposer of FIG. 11B according to an embodiment of the disclosure.

FIG. 11A shows a PBA in which at least one electronic component is mounted on a second PCB according to an embodiment of the disclosure. FIG. 11B is a lateral perspective view of a PBA of FIG. 11A according to an embodiment of the disclosure. FIG. 11C shows a first PCB and an interposer of FIG. 11B according to an embodiment of the disclosure.

Referring to FIGS. 11A to 11C together, a PBA 400 according to an embodiment may include a first PCB 411, a second PCB 412, an interposer 420, and at least one electronic component 1110 disposed on the second PCB 412. In connection with the aforementioned description, like or similar reference numerals may be used for like or similar elements and an overlapping description thereof will be omitted.

According to an embodiment of the disclosure, the second PCB 412 may be disposed substantially parallel to the first PCB 411. According to an embodiment of the disclosure, the first PCB 411 may have a fist size and the second PCB 412 may have a second size equal to or smaller than the first size. According to an embodiment of the disclosure, the second PCB 412 may be disposed to overlap at least a part of the first PCB 411.

According to an embodiment of the disclosure, the at least one electronic component 1110 may be disposed on the first PCB 411 and/or the second PCB 412. According to an embodiment of the disclosure, the at least one electronic component 1110 may include a wireless communication circuit. For example, the at least one electronic component 1110 disposed on the second PCB 412 may include a component associated with RF signal transmission (e.g.: RF power amplifier module (PAM)).

According to an embodiment of the disclosure, the interposer 420 may include a first partition wall structure 421 and/or a second partition wall structure 422 extending from the first partition wall structure 421. According to an embodiment of the disclosure, the second partition wall structure 422 may include at least one conductive via 470. According to an embodiment of the disclosure, the first PCB 411, the second PCB 412, and the first partition wall structure 422 may form an empty space therein. According to an embodiment of the disclosure, the first PCB 411, the second PCB 412, the partition wall structure 422, and the empty space may be used to form an antenna. By way of example, the at least one electronic component 1110 may be disposed outside the empty space of the PBA 400, which is used as an antenna, and in this case, the antenna may be formed by the PBA 400.

Figure 12A:
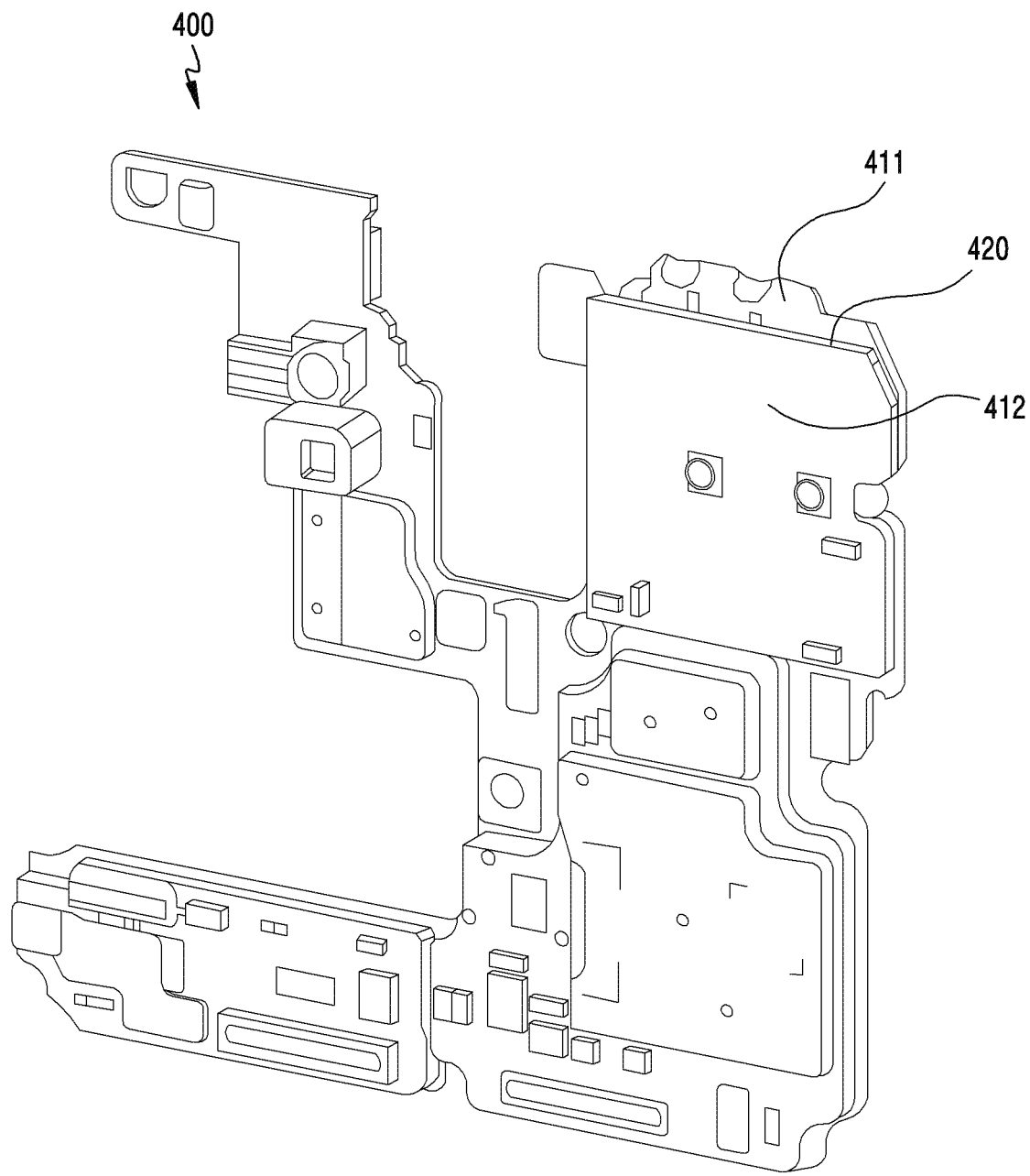
FIG. 12A shows a PBA in which at least one electronic component is mounted according to an embodiment of the disclosure.

FIG. 12A shows a PBA in which at least one electronic component is mounted according to an embodiment of the disclosure.

Figure 12B:
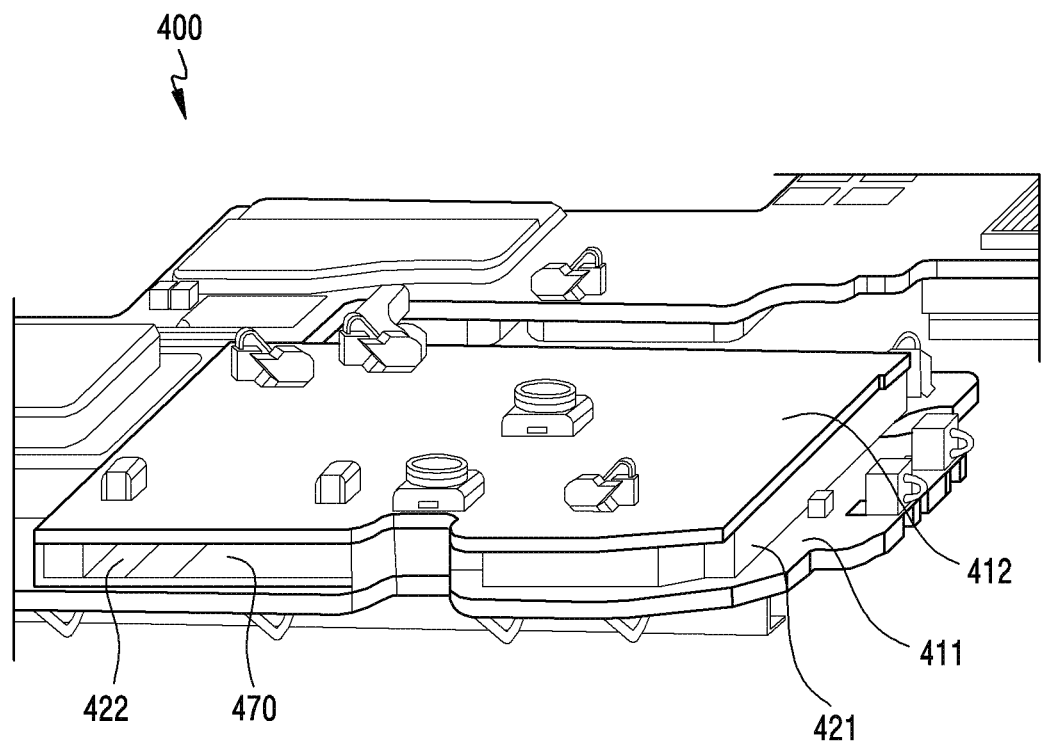
FIG. 12B is a lateral perspective view of a PBA of FIG. 12A according to an embodiment of the disclosure.

FIG. 12B is a lateral perspective view of a PBA of FIG. 12A according to an embodiment of the disclosure.

Figure 12C:
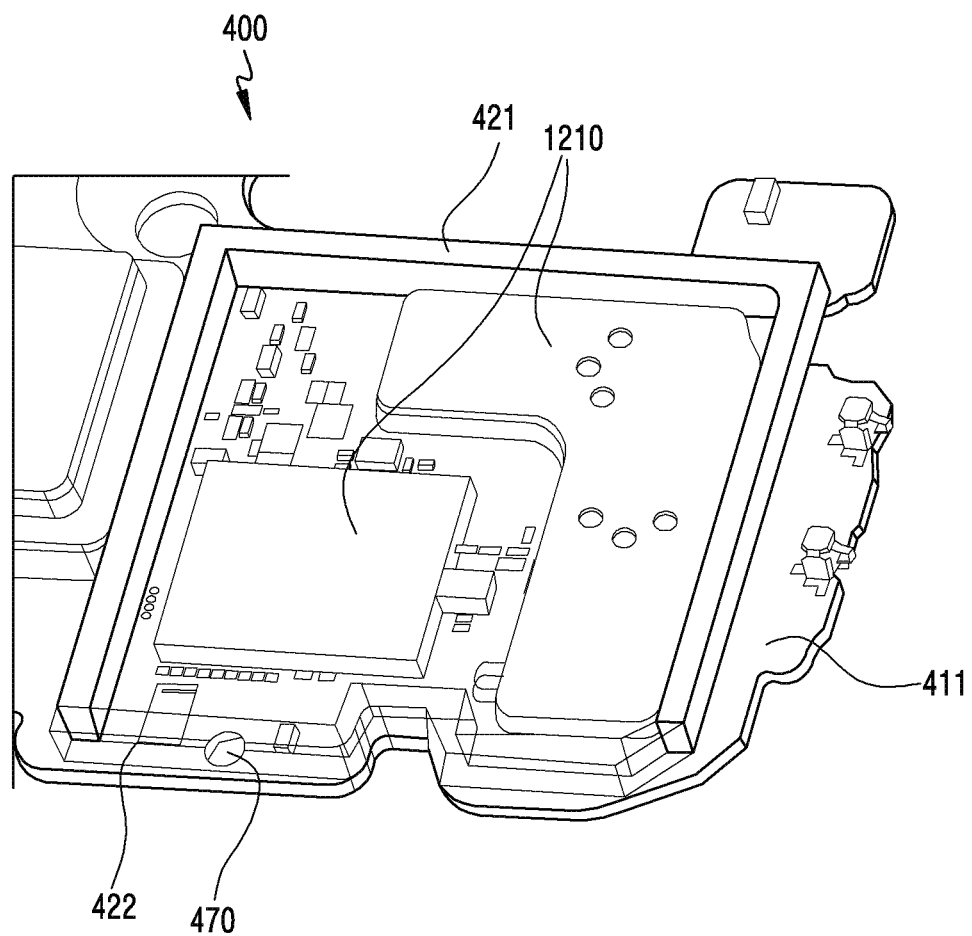
FIG. 12C shows a first PCB, at least one electronic component, and an interposer of FIG. 12B according to an embodiment of the disclosure.

FIG. 12C shows a first PCB, at least one electronic component, and an interposer of FIG. 12B according to an embodiment of the disclosure.

Referring to FIGS. 12A to 12C together, a PBA 400 according to an embodiment may include a first PCB 411, a second PCB 412, an interposer 420, and/or at least one electronic component 1210 disposed on an empty space formed by the first PCB 411, the second PCB 412, and the interposer 420. In connection with the aforementioned description, like or similar reference numerals may be used for like or similar elements and an overlapping description thereof will be omitted.

According to an embodiment of the disclosure, the at least one electronic component 1210 may be disposed on the first PCB 411. According to an embodiment of the disclosure, the at least one electronic component 1210 may be disposed on a surface of the second PCB 412, which faces the first PCB 411. According to an embodiment of the disclosure, the at least one electronic component 1210 may include a wireless communication circuit. For example, the at least one electronic component 1210 disposed on the first PCB 411 may include a component associated with RF signal transmission (e.g.: attenuator).

According to an embodiment of the disclosure, the interposer 420 may include a first partition wall structure 421 and/or a second partition wall structure 422 extending from the first partition wall structure 421. According to an embodiment of the disclosure, the second partition wall structure 422 may include at least one conductive via 470. According to an embodiment of the disclosure, the first PCB 411, the second PCB 412, and the interposer 420 may form a space in which at least one electronic component 1210 is disposed. According to an embodiment of the disclosure, the first partition wall structure 421 may provide electromagnetic shielding for the at least one electronic component 1210 disposed in the space of the PBA 400. For example, a noise which may be caused by the at least one electronic component 1210 may not be transferred to the outside of the PBA 400.

Figure 13:
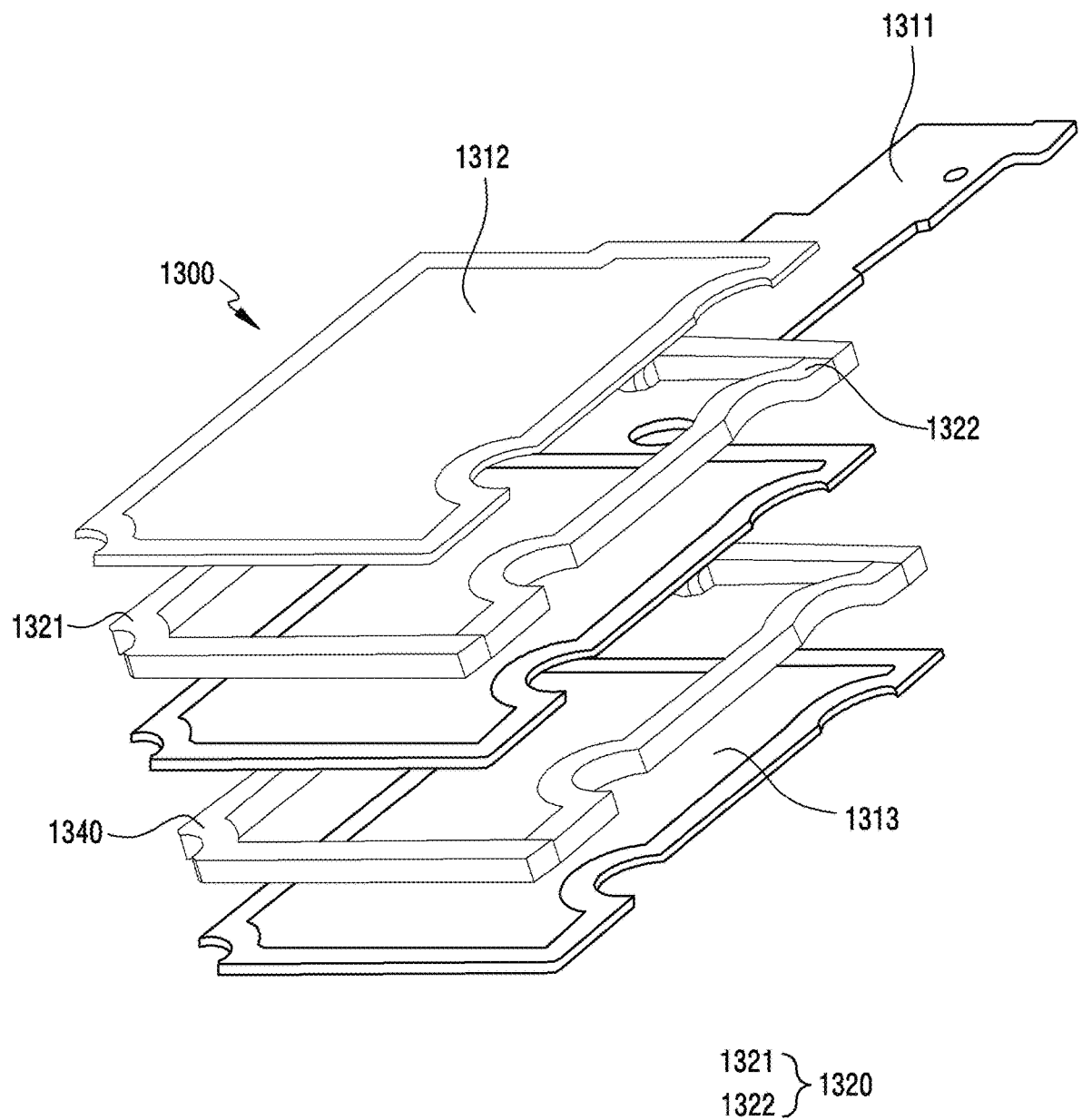
FIG. 13 shows a PBA including multiple interposers according to an embodiment of the disclosure.

FIG. 13 shows a PBA including multiple interposers according to an embodiment of the disclosure.

Referring to FIG. 13, a PBA 1300 (e.g.: PBA 400 of FIG. 4) according to an embodiment may include a first PCB 1311 (e.g.: first PCB 411 of FIG. 4), a second PCB 1312 (e.g.: second PCB 412 of FIG. 4), a third PCB 1313, a first interposer 1320 (e.g.: interposer 420 of FIG. 4), and a second interposer 1340. At least a part of the components described above may be referred to the composition of FIG. 4, and an overlapping description thereof may be omitted.

According to an embodiment of the disclosure, the first PCB 1311 and the second PCB 1312 may be connected to each other through the first interposer 1320. According to an embodiment of the disclosure, the first PCB 1311, the second PCB 1312, and the interposer 1320 may be coupled to each other to form at least one space. According to an embodiment of the disclosure, the first interposer 1320 may include a first partition wall structure 1321 (e.g.: first partition wall structure 421 of FIG. 4) and a second partition wall structure 1322 (e.g.: second partition wall structure 422 of FIG. 4) extending from the first partition wall structure 1321 and including a dielectric material.

According to an embodiment of the disclosure, the PBA 1300 may include a first electronic component (e.g.: at least one electronic component 1110 of FIG. 11B) disposed in a space surrounded by the first PCB 1311, the second PCB 1312, and the first interposer 1320. According to an embodiment of the disclosure, the first electronic component may be disposed on a surface of the first PCB 1311, which faces the second PCB 1312. According to an embodiment of the disclosure, the first electronic component may be disposed on a surface of the first PCB 1311, which faces the second PCB 1312. According to an embodiment of the disclosure, the first electronic component may include an anti-noisy electronic component which does not generate a noise.

According to an embodiment of the disclosure, the first PCB 1311 and the third PCB 1313 may be coupled to each other through the second interposer 1340. According to an embodiment of the disclosure, the first PCB 1311, the third PCB 1313, and the second interposer 1340 may be coupled to each other to form at least one space. According to an embodiment of the disclosure, the second interposer 1340 may include multiple conductive vias (e.g.: multiple conductive vias 460 of FIG. 4).

According to an embodiment of the disclosure, the PBA 1300 may include a second electronic component (e.g.: at least one electronic component 1110 of FIG. 11B) disposed in a space surrounded by the first PCB 1311, the third PCB 1313, and the second interposer 1340. According to an embodiment of the disclosure, the second electronic component may be disposed on a surface of the third PCB 1313, which faces the first PCB 1311. According to another embodiment of the disclosure, the second electronic component may be disposed on a surface of the first PCB 1311, which faces the third PCB 1313. According to an embodiment of the disclosure, the second electronic component may include a noisy electronic component which generates noise (e.g.: RF PAM). According to an embodiment of the disclosure, the second interposer 1340 may provide electromagnetic shielding for the second electronic component.

According to an embodiment of the disclosure, a first antenna may be formed by using the first PCB 1311, the second PCB 1312, and the first interposer 1320. According to another embodiment of the disclosure, a second antenna may be formed by using the first PCB 1311, the third PCB 1313, and the second interposer 1340.

Figure 14:
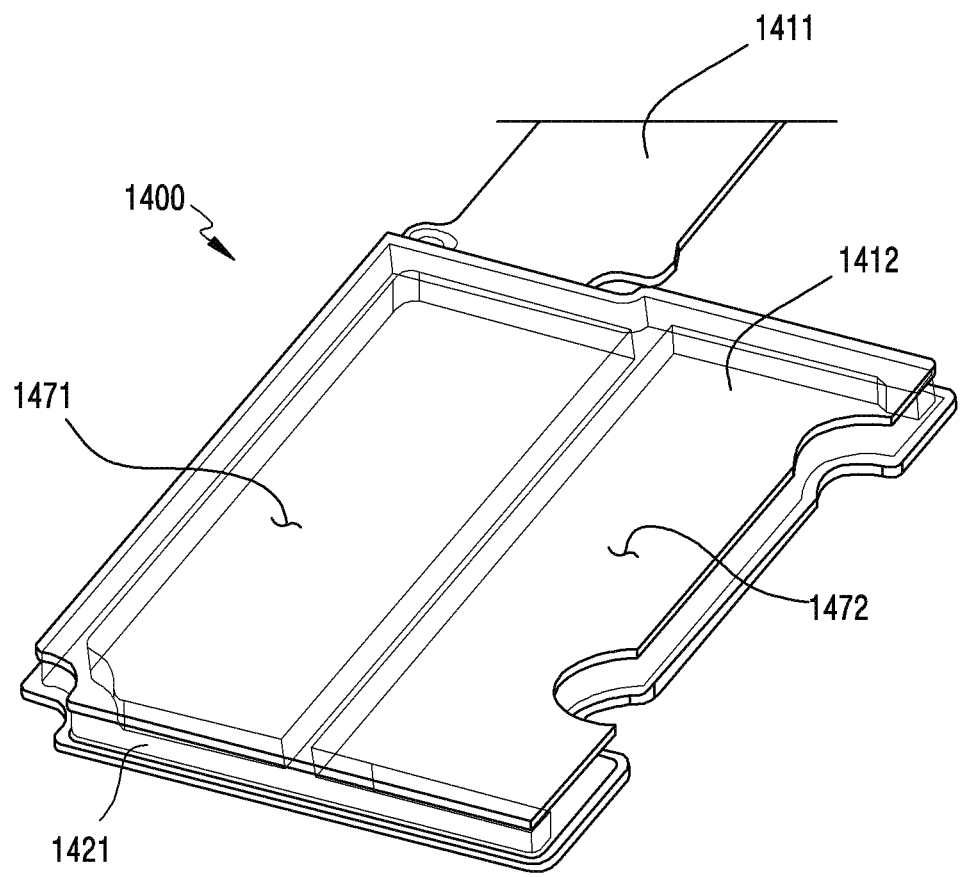
FIG. 14 shows a PBA including a first space and a second space therein according to an embodiment of the disclosure.

FIG. 14 shows a PBA including a first space and a second space therein according to an embodiment of the disclosure.

Referring to FIG. 14, a PBA 1400 (e.g.: PBA 400 of FIG. 4) according to an embodiment may include a first PCB 1411 (e.g.: first PCB 411 of FIG. 4), a second PCB 1412 (e.g.: second PCB 412 of FIG. 4), and an interposer 1420 (e.g.: interposer 420 of FIG. 4). A part of the components described above may be referred to the component of FIG. 4, and an overlapping description thereof may be omitted.

According to an embodiment of the disclosure, the interposer 1420 may include a first partition wall structure 1421 (e.g.: first partition wall structure 421 of FIG. 4) and a second partition wall structure (not shown) (e.g.: second partition wall structure 422 of FIG. 4) extending from the first partition wall structure 1321 and including a dielectric material. According to another embodiment of the disclosure, a part (e.g.: second partition wall structure) of aforementioned composition may be omitted and another composition may be added.

According to an embodiment of the disclosure, the first PCB 1411 and the second PCB 1412 may be coupled to each other through the interposer 1420. According to an embodiment of the disclosure, the PCB 1411, the second PCB 1412, and the interposer 1420 may be coupled to each other to form at least one space. According to an embodiment of the disclosure, a space formed by coupling the first PCB 1411, the second PCB 1412, and the interposer 1420 may include a first space 1471 surrounded by a first partition wall structure 1421 and a second space 1472 physically or electrically separated from the first space 1471.

According to an embodiment of the disclosure, PBA 1400 may include at least one electronic component disposed in the first space 1471 and/or the second space 1472. According to an embodiment of the disclosure, the at least one electronic component may include a first electronic component generating a noise and a second electronic component not generating a noise. According to an embodiment of the disclosure, the first electronic component may be disposed in the first space 1471 and the second electronic component may be disposed in the second space 1472. For example, a noisy RF component may be disposed in an area of the first PCB 1411, adjacent to the second PCB 1412 and corresponding to the first space 1471. For example, an anti-noisy electronic component (e.g.: battery) may be disposed in an area of the second PCB 1412, adjacent to the first PCB 1411 and corresponding to the second space 1472.

According to an embodiment of the disclosure, the first partition wall structure 1421 may include multiple conductive vias and/or a lateral plating (e.g.: gold (Au)). According to an embodiment of the disclosure, the first partition wall structure 1421 may provide electromagnetic shielding for the first electronic component.

According to an embodiment of the disclosure, a size of the first space 1471 and/or the second space 1472 may be determined based on an operation frequency of an antenna formed by using the second space 1472.

Figure 15:
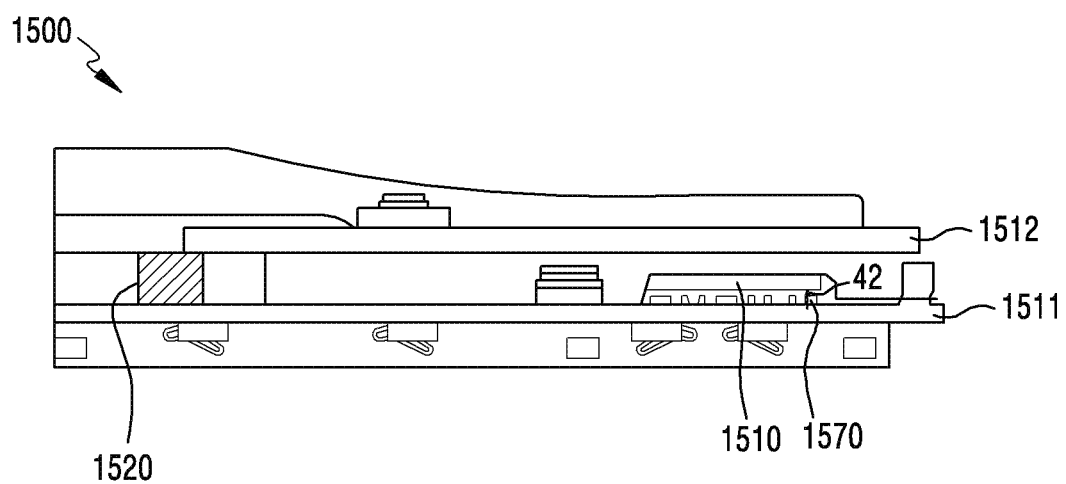
FIG. 15 shows a cross-sectional view of a PBA including a shield can according to an embodiment of the disclosure.

FIG. 15 shows a cross-sectional view of a PBA including a shield can according to an embodiment of the disclosure.

Referring to FIG. 15, a PBA 1500 may include an interposer 1520 (e.g.: interposer 420 of FIG. 4), a conductive via 1570 (e.g.: conductive via 470 of FIG. 4), a first PCB 1511 (e.g.: first PCB 411 of FIG. 4), a second PCB 1512 (e.g.: second PCB 412 of FIG. 4), and a shield can 1510. A part of the components described above may be referred to the component of FIG. 4, and an overlapping description thereof may be omitted.

According to an embodiment of the disclosure, the shield can 1510 may be disposed in a space formed by the first PCB 1511, the second PCB 1512, and the interposer 1520. For example, the shield can 1510 may be disposed on a surface of the first PCB 1511, which is closer to the second PCB 1512. For example, the shield can 1510 may be disposed on a surface of the second PCB 1512, which is closer to the first PCB 1511.

According to an embodiment of the disclosure, the shield can 1510 may be electrically connected to the conductive via 1570.

In an embodiment of the disclosure, when the shield can 1510 is disposed on the second PCB 1512, the shield can 1510 may be electrically connected to a second ground of the second PCB 1512. When an antenna is formed by using the first PCB 1511, the second PCB 1512, and the interposer 1520, the power feeding to the shield can 1510 may be performed by using a power feeding line 42 disposed on the first PCB 1511 and a conductive connection member (not shown), such as a C-grip.

According to an embodiment of the disclosure, the wireless communication circuit (not shown) may feed power to the first PCB 1511 and/or the second PCB 1512 through the shield can 1510 and/or the conductive via 1570.

Figure 16A:
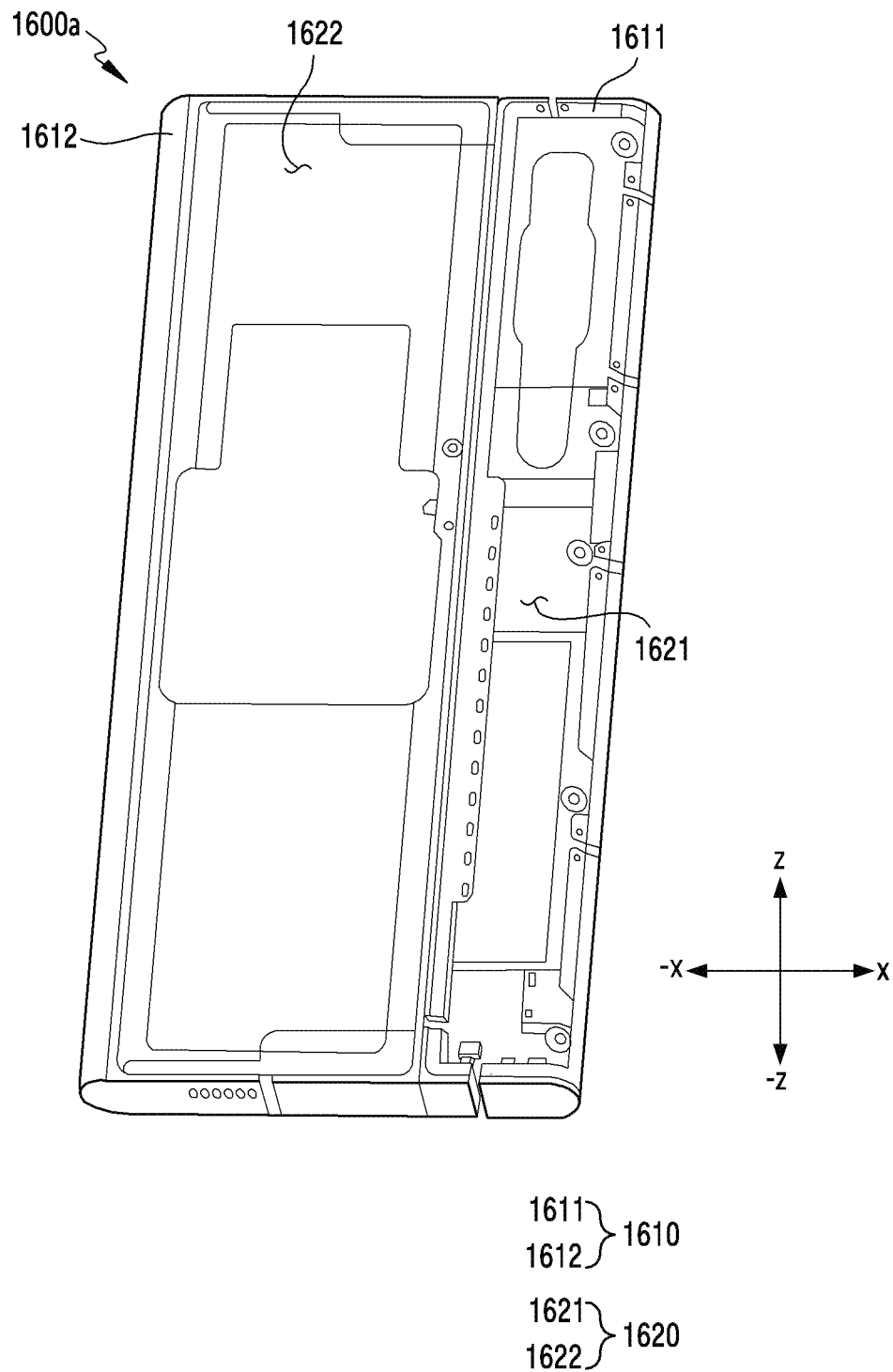
FIG. 16A is a perspective view illustrating an electronic device in a first state according to an embodiment of the disclosure.

FIG. 16A is a perspective view illustrating an electronic device in a first state according to an embodiment of the disclosure.

Figure 16B:
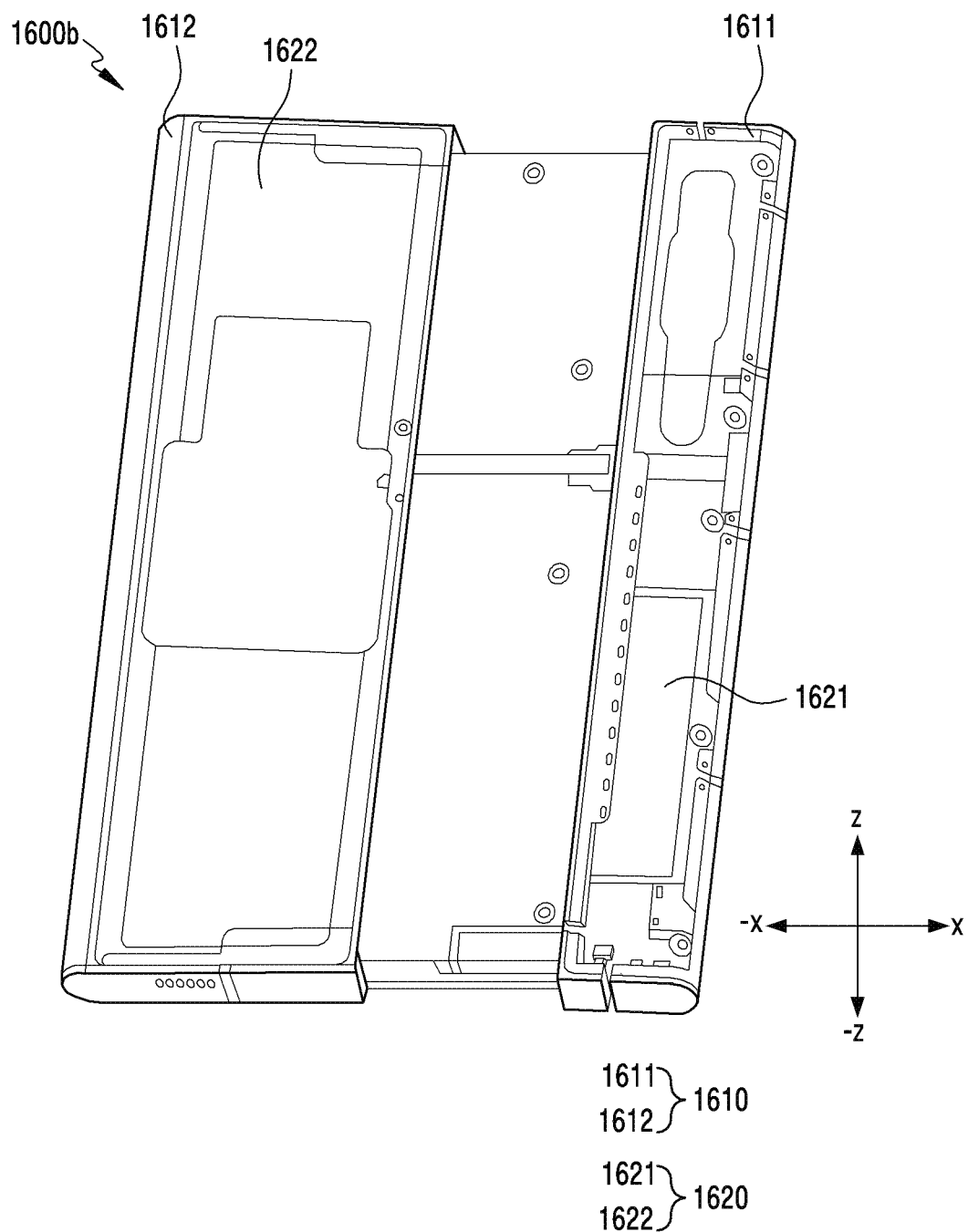
FIG. 16B is a perspective view illustrating an electronic device in a second state according to an embodiment of the disclosure.

FIG. 16B is a perspective view illustrating an electronic device in a second state according to an embodiment of the disclosure.

Referring to FIGS. 16A and 16B, an electronic device 1600 according to an embodiment may include a flexible display (not shown) and a housing 1610 forming an outer frame of the electronic device 1600. According to an embodiment of the disclosure, the electronic device 1600 may include a first housing 1611 and a second housing 1612 capable of moving (e.g.: sliding in and sliding out) with respect to the first housing 1611. For example, the flexible display may have an area which may be visually seen from the outside and changed according to an operation of the first housing 1611 and/or the second housing 1612. According to an embodiment of the disclosure, a first state 1600a may be a state in which at least a part of the first housing 1611 is slid into the second housing 1612. According to another embodiment of the disclosure, a first state 1600a may be a state in which at least a part of the second housing 1612 is slid into the first housing 1611. For example, the first state 1600a may be a state in which the area of the flexible display, which is visually seen from the outside, is smallest.

According to an embodiment of the disclosure, when the electronic device 1600 is in the first state 1600a, the second housing 1612 may move in a first direction (e.g.: +x direction). For example, when the second housing 1612 moves in a direction farther from the first housing 1611 according to a predetermined input (e.g.: user input or tension), the first state 1600a of the electronic device 1600 may be switched to a second state 1600b. For example, the second state 1600b may be a state in which the area of the flexible display, which is visually seen from the outside, is largest. In an embodiment of the disclosure, there may be an intermediate state between the first state 1600a and the second state 1600b.

According to an embodiment of the disclosure, when the electronic device 1600 is in the second state, the second housing 1612 may move in a second direction (e.g.: −x direction). For example, when the second housing 1612 moves in a direction closer to the first housing 1611 according to a predetermined input (e.g.: user input or tension), the second state of the electronic device 1600 may be switched to the first state 1600b.

According to an embodiment of the disclosure, a rear cover 1620 (e.g.: rear plate 111 of FIG. 1) may be disposed on a surface of the electronic device 1600. Hereinafter, the surface in which the rear cover 1620 is disposed is referred to the rear surface. According to an embodiment of the disclosure, the rear cover 1620 may occupy substantially most of the rear surface of the electronic device 1600. According to an embodiment of the disclosure, the rear cover 1620 may include a first rear cover 1621 coupled to the first housing 1611 and a second rear cover 1622 coupled to the second housing 1612. According to an embodiment of the disclosure, when the electronic device 1600 is in a first state 1600a, the first rear cover 1621 and the second rear cover 1622 may be in contact or adjacent to each other to be seen like one rear cover 1620.

According to an embodiment of the disclosure, the electronic device 1600 may include a bendable member (or bendable support member) (e.g.: hinge rail or multi-joint hinge module) which may form the same plane with at least a part of the first housing 1611 in the second state 1600b and may be received in an inner space of the second housing 1612 in the first state 1600a. According to an embodiment of the disclosure, at least a part of the flexible display may be received in the inner space of the second housing 1612 in the first state 1600a while being supported by the bendable support member so as to be disposed not to be visually seen from the outside. According to an embodiment of the disclosure, at least a part of the flexible display may be disposed to be visually seen from the outside while being supported by the bendable support member which forms the same plane with at least a part of the first housing 1611 in the second state 1600b.

Figure 17A:
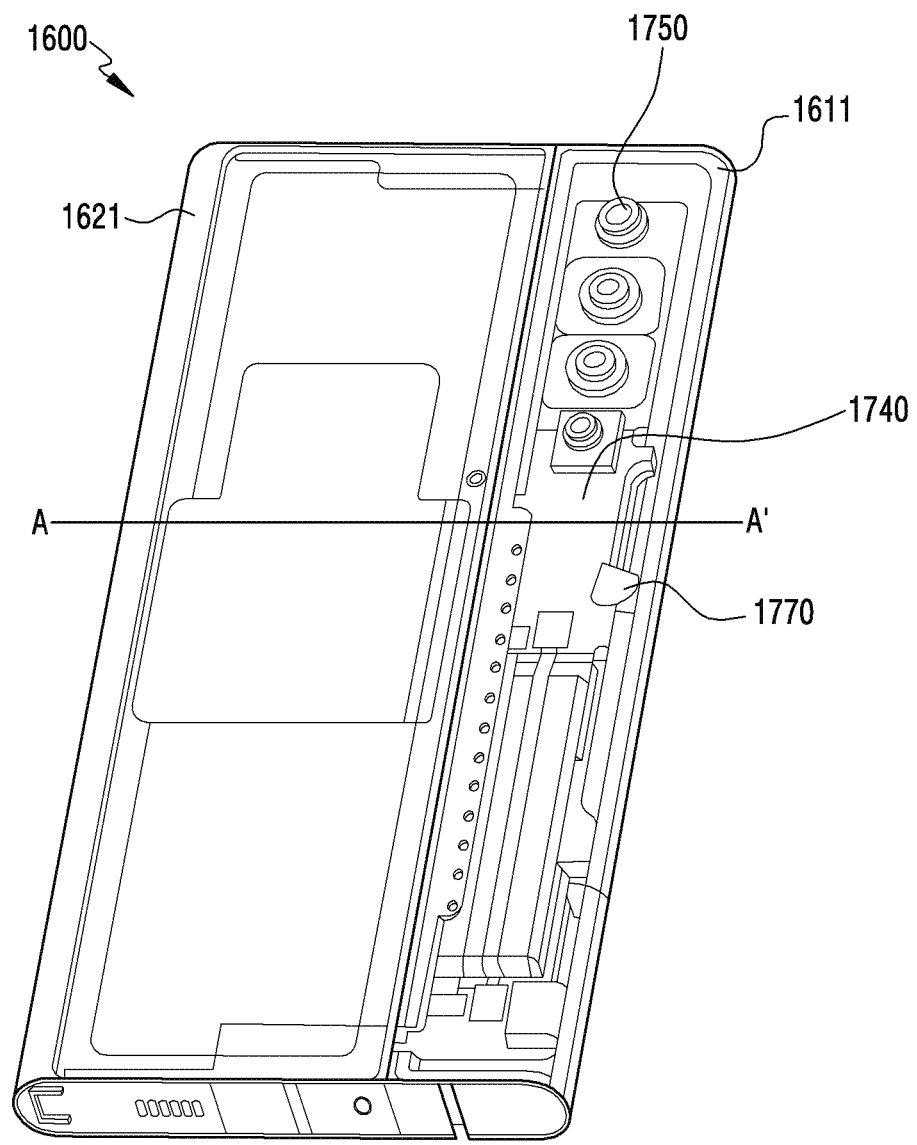
FIG. 17A is a perspective view illustrating an electronic device in which a PBA is mounted according to an embodiment of the disclosure.

FIG. 17A is a perspective view illustrating an electronic device in which a PBA is mounted according to an embodiment of the disclosure.

Figure 17B:
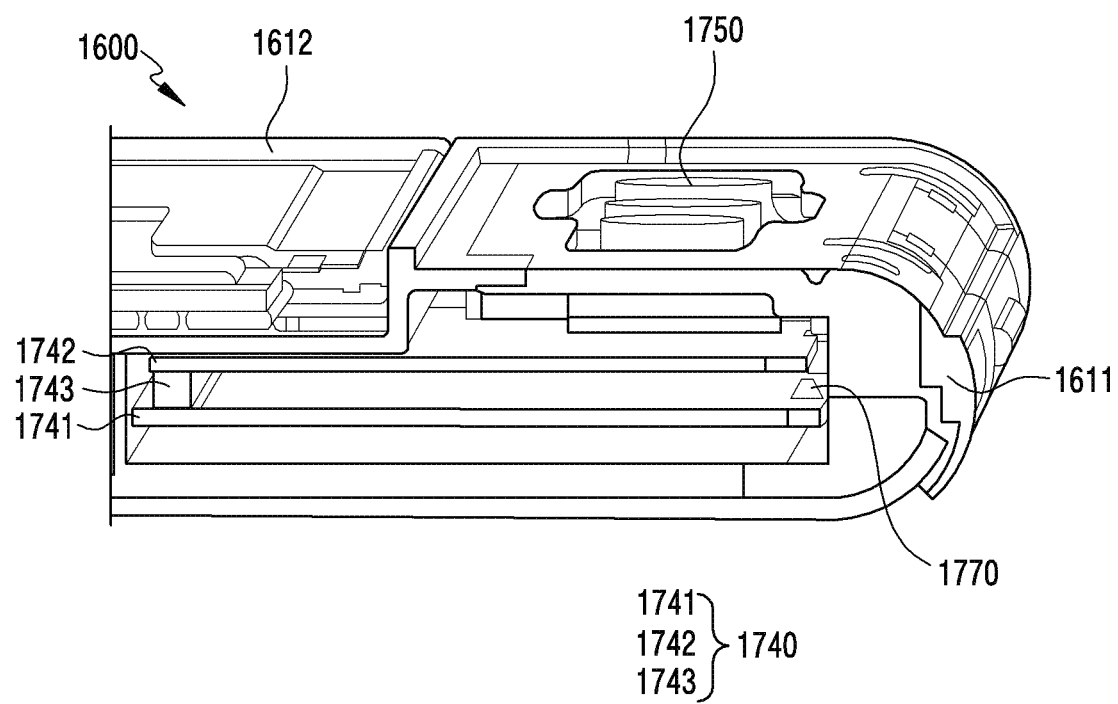
FIG. 17B is a cross-sectional view taken along A-A' of an electronic device of FIG. 17A according to an embodiment of the disclosure.

FIG. 17B is a cross-sectional view taken along A-A' of an electronic device of FIG. 17A according to an embodiment of the disclosure.

Referring to FIGS. 17A and 17B together, an electronic device 1600 according to an embodiment of the disclosure may include a first housing 1611, a second housing 1612, a camera structure 1750 (e.g.: camera structure 850 of FIG. 8A), and/or a PBA 1740 (e.g.: PBA 400 of FIG. 4). In connection with the aforementioned description, like or similar reference numerals may be used for like or similar elements and an overlapping description thereof will be omitted.

According to an embodiment of the disclosure, the PBA 1740 may include a first PCB 1741 (e.g.: first PCB 411 of FIG. 4), a second PCB 1742 (e.g.: second PCB 412 of FIG. 4) disposed substantially parallel to the first PCB 1741, and an interposer 1743 (e.g.: interposer 420 of FIG. 4).

According to an embodiment of the disclosure, the camera structure 1750 may be disposed in the electronic device 1600. According to an embodiment of the disclosure, the camera structure 1750 may be disposed in the first housing 1611. According to an embodiment of the disclosure, the first housing 1611 may include at least one groove therein, and at least a part of the camera structure 1750 may be disposed in the groove in the first housing 1611. According to an embodiment of the disclosure, the camera structure 1750 may include at least one optical lens.

According to an embodiment of the disclosure, the PBA 1740 including a power feeding part 1770 may be disposed adjacent to the camera structure 1750. According to an embodiment of the disclosure, the PBA 1740 may include an antenna formed by using the first PCB 1741, the second PCB 1742, and the interposer 1743. A wireless communication circuit may feed power to the antenna through the power feeding part 1770. The power feeding part 1770 may include a conductive via or a conductive connection member, such as a C-clip.

According to an embodiment of the disclosure, at least a part of the PBA 1740 may be disposed to overlap at least a part of the camera structure 1750. According to an embodiment of the disclosure, the PBA 1740 may be disposed in the first housing 1611. According to an embodiment of the disclosure, the PBA 1740 may be disposed in a groove disposed in the first housing 1611. According to an embodiment of the disclosure, the PBA 1740 may be disposed adjacent to a lateral surface of the first housing 1611, but is not limited thereto. According to another embodiment of the disclosure, when the electronic device is in a first state 1600a, the PBA 1740 may be disposed in a space surrounded by the first housing 1611 and the second housing 1612.

According to an embodiment of the disclosure, the interposer 1743 may include a first partition wall structure (e.g.: first partition wall structure 421 of FIG. 4) and a second partition wall structure (e.g.: second partition wall structure 422 of FIG. 4). The second partition wall structure may be disposed father from the second housing 1611 than the first partition wall structure. For example, an antenna formed by using the first PCB 1741, the second PCB 1742, and the interposer 1743 may transmit and/or receive a signal in a direction to the second partition wall structure disposed.

Figure 18A:
FIG. 18A shows a radiation pattern over an electronic device using an PBA of FIG. 17A according to an embodiment of the disclosure.

FIG. 18A shows a radiation pattern of an antenna formed on a PBA of FIG. 17A over an electronic device according to an embodiment of the disclosure.

Figure 18B:
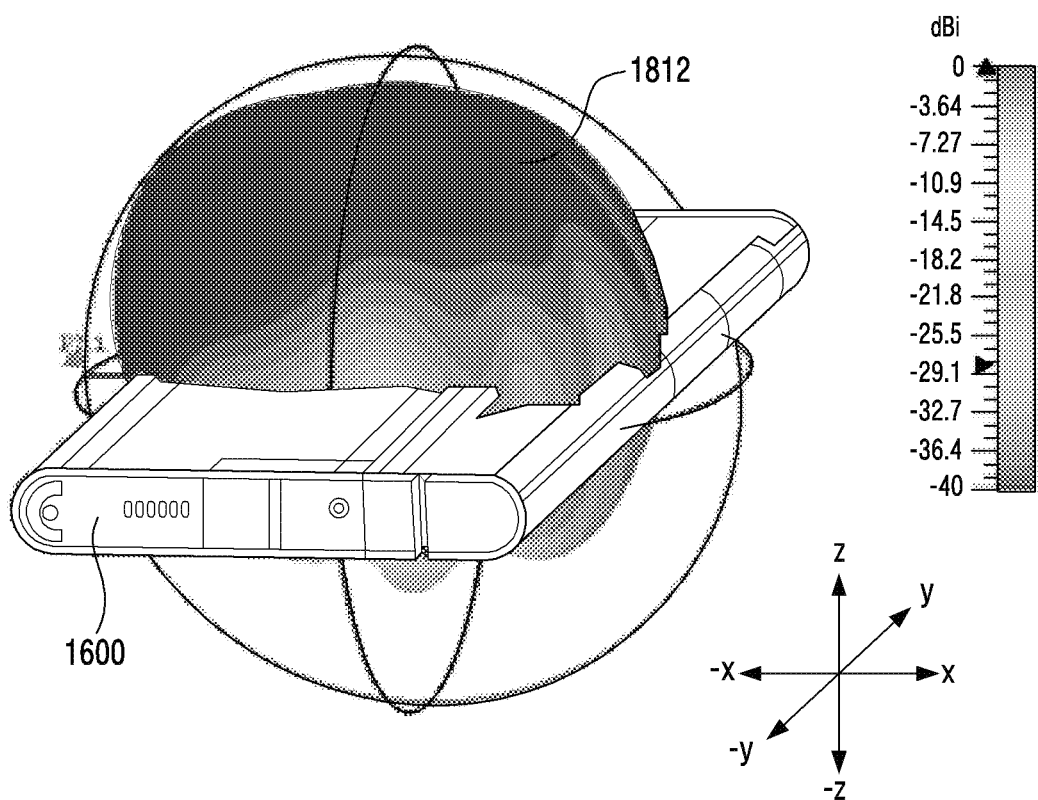
FIG. 18B shows a radiation pattern to an outside of an electronic device using a PBA of FIG. 17A according to an embodiment of the disclosure.

FIG. 18B shows a radiation pattern of an antenna formed on a PBA of FIG. 17A to the outside of an electronic device according to an embodiment of the disclosure.

Figure 18C:
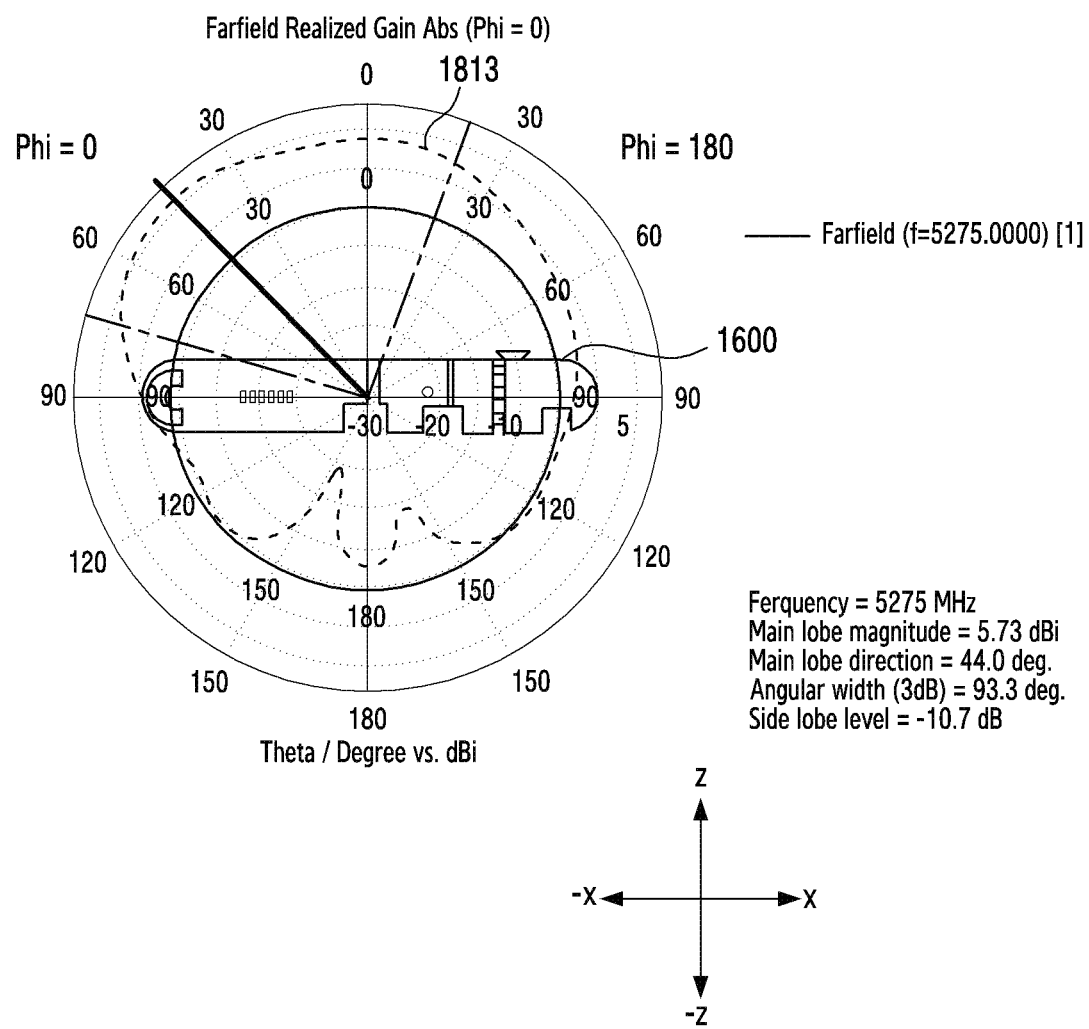
FIG. 18C shows a radiation pattern using the PBA of FIG. 17A according to an embodiment of the disclosure.

FIG. 18C shows a cross-sectional view of a radiation pattern of an antenna formed on the PBA of FIG. 17A according to an embodiment of the disclosure.

Referring to FIGS. 18A to 18C together, an electronic device according to an embodiment may include a wireless communication circuit. According to an embodiment of the disclosure, the wireless communication circuit may radiate a signal in a specified frequency band by feeding power to an antenna formed on a PBA (e.g.: PBA 1740 of FIG. 17B). According to an embodiment of the disclosure, the wireless communication circuit may radiate a signal according to a first radiation patter 1811 centering on a position at which the PBA is disposed by feeding power to the antenna formed on the PBA.

According to an embodiment of the disclosure, a signal radiated from an antenna formed by using the PBA may be radiated according to a second radiation pattern 1812 centering on the antenna. According to an embodiment of the disclosure, a signal radiated from an antenna formed by using the PBA may be radiated according to a second cross-sectional radiation pattern 1813 centering on the antenna. According to an embodiment of the disclosure, the wireless communication circuit may radiate an RF signal to a front surface (e.g.: +z direction), a lateral surface (e.g.: +x direction and −x direction), and a rear surface (e.g.: −z direction) of the electronic device 1600 by feeding power to an antenna formed on the PBA.

According to an embodiment of the disclosure, an PBA (e.g.: PBA 400 of FIG. 4) disposed in the electronic device 1600 may be used as an antenna. According to an embodiment of the disclosure, by using the PBA as an antenna, deterioration of radiation performance through a rear surface (e.g.: +z direction) of the electronic device 1600 after the state switch (e.g.: switch from first state 1600a to second state 1600b) of the electronic device 1600 may be reduced. According to an embodiment of the disclosure, reduction of signal radiation performance may be prevented by using at least a part of the PBA as an antenna.

Figure 19A:
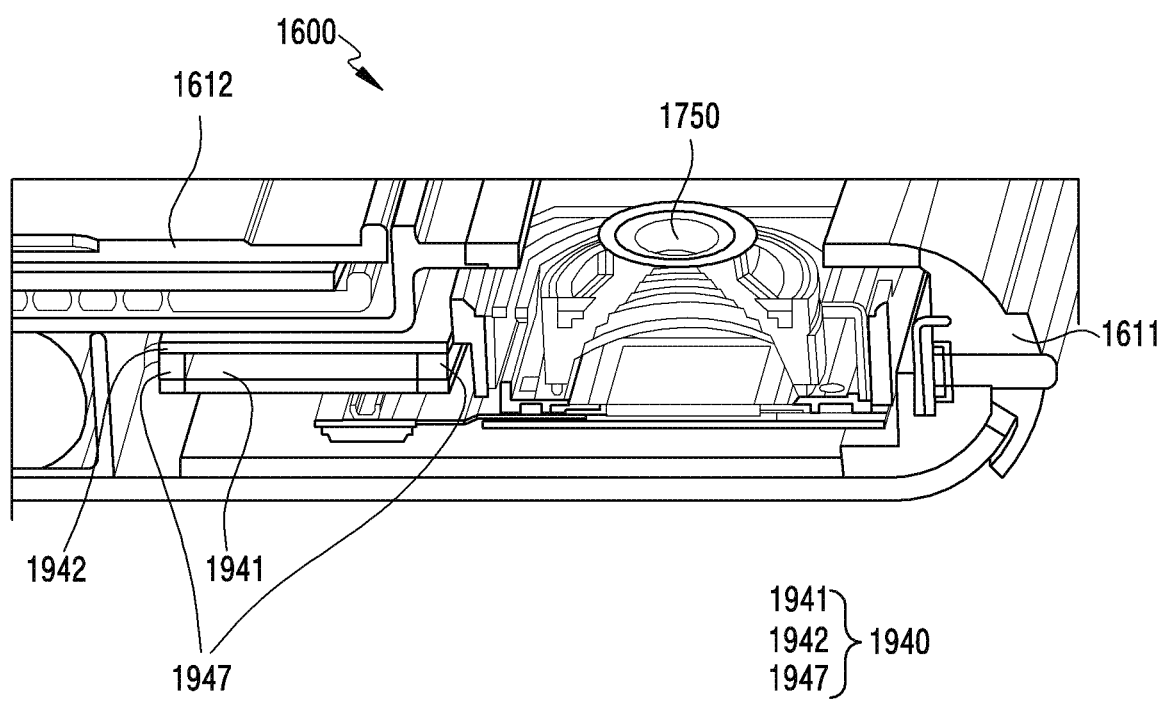
FIG. 19A is a cross-sectional view of a camera structure and an electronic device in which a camera structure and a PBA is mounted according to an embodiment of the disclosure.

FIG. 19A is a cross-sectional view of a camera structure and an electronic device in which a camera structure and a PBA is mounted according to an embodiment of the disclosure.

Figure 19B:
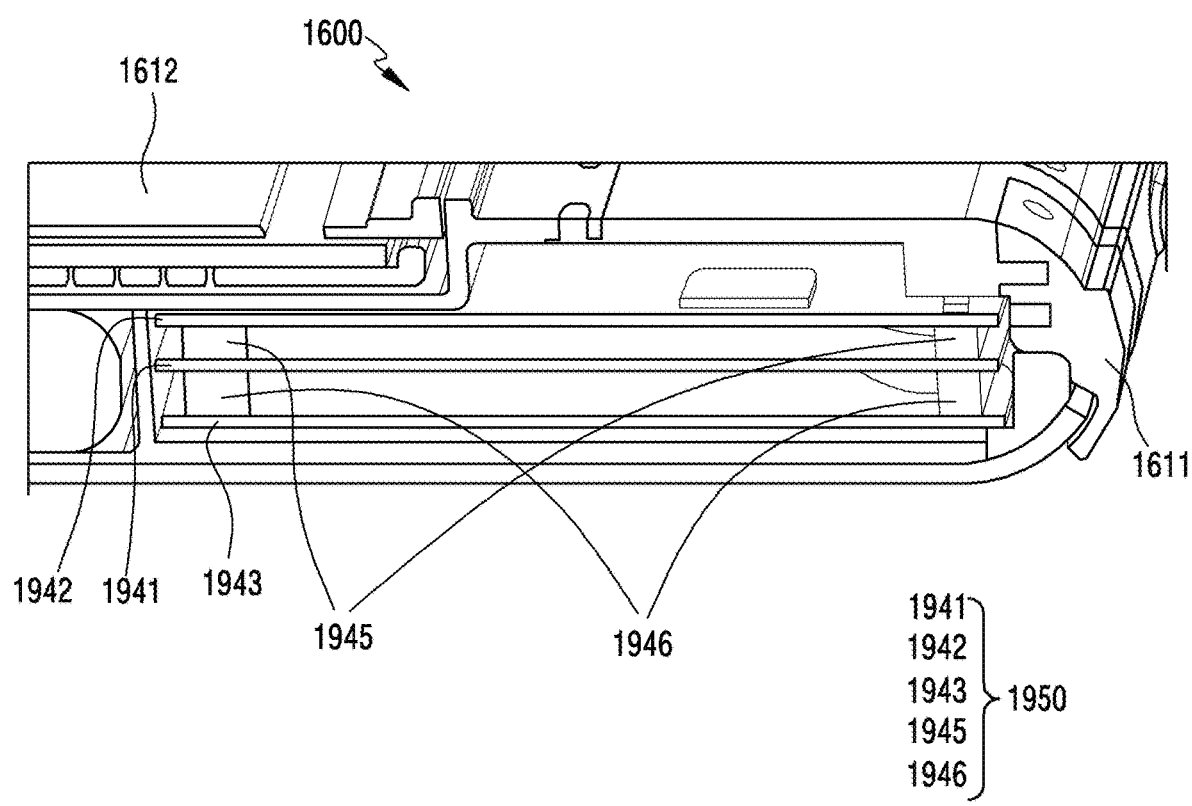
FIG. 19B is a cross-sectional view of an electronic device in which a PBA is mounted according to an embodiment of the disclosure.

FIG. 19B is a cross-sectional view of an electronic device in which a PBA is mounted according to an embodiment of the disclosure.

Referring to FIGS. 19A and 19B together, an electronic device 1600 according to an embodiment may include a first housing 1611, a second housing 1612, a PBA 1940 or 1950 (e.g.: PBA 400 of FIG. 4), and/or a camera structure 1750 (e.g.: camera structure 850 of FIG. 8A). In connection with the aforementioned description, like or similar reference numerals may be used for like or similar elements and an overlapping description thereof will be omitted.

Referring to FIG. 19A, the PBA 1940 may be disposed adjacent to the second housing 1612 and the camera structure 1750 (e.g.: camera module 2080 of FIG. 20) in the electronic device 1600. According to an embodiment of the disclosure, the PBA 1940 may be disposed adjacent to a lateral surface of the camera structure 1750. According to another embodiment (not shown), the PBA 1940 may be disposed to overlap at least a part of a battery.

According to an embodiment of the disclosure, the PBA 1940 may include a first PCB 1941 (e.g.: first PCB 411 of FIG. 4), a second PCB 1942 (e.g.: second PCB 412 of FIG. 4), and an interposer 1947 (e.g.: interposer 420 of FIG. 4). According to an embodiment of the disclosure, the first PCB 1941 and the second PCB 1942 may be coupled to the interposer 1947 to form a stacked structure. The composition of the PBA 1940 described above may be referred to the composition of the PBA 400 of FIG. 4. According to an embodiment of the disclosure, the first PCB 1941, the second PCB 1942, and the interposer 1947 may form an antenna.

According to an embodiment of the disclosure, the PBA 1950 may include multiple interposers 1945 and 1946. The PBA 1950 (e.g.: PBA 1300 of FIG. 13) according to an embodiment may include a first PCB 1941 (e.g.: first PCB 1311 of FIG. 13), a second PCB 1942 (e.g.: second PCB 1312 of FIG. 13), a third PCB 1943 (e.g.: third PCB 1313 of FIG. 13), a first interposer 1945 (e.g.: interposer 1320 of FIG. 13), and a second interposer 1946 (e.g.: second interposer 1340 of FIG. 13).

According to an embodiment of the disclosure, the first PCB 1941, the second PCB 1942, and the third PCB 1943 may be coupled to the first interposer 1945 and the second interposer 1946 to form a stacked structure. The composition of the PBA 1950 described above may be referred to the composition of the PBA 1300 of FIG. 13. According to an embodiment of the disclosure, the first PCB 1941, the second PCB 1942, and the first interposer 1945 may form an antenna. According to another embodiment of the disclosure, the first PCB 1941, the third PCB 1943, and the second interposer 1946 may form an antenna.

According to an embodiment of the disclosure, when the PBA 1950 is formed to be three layered to be used as an antenna, such as the one of FIG. 19B, a space of the electronic device 1600 may be utilized better than the two-layered PBA 1940 of FIG. 19A.

Figure 20:
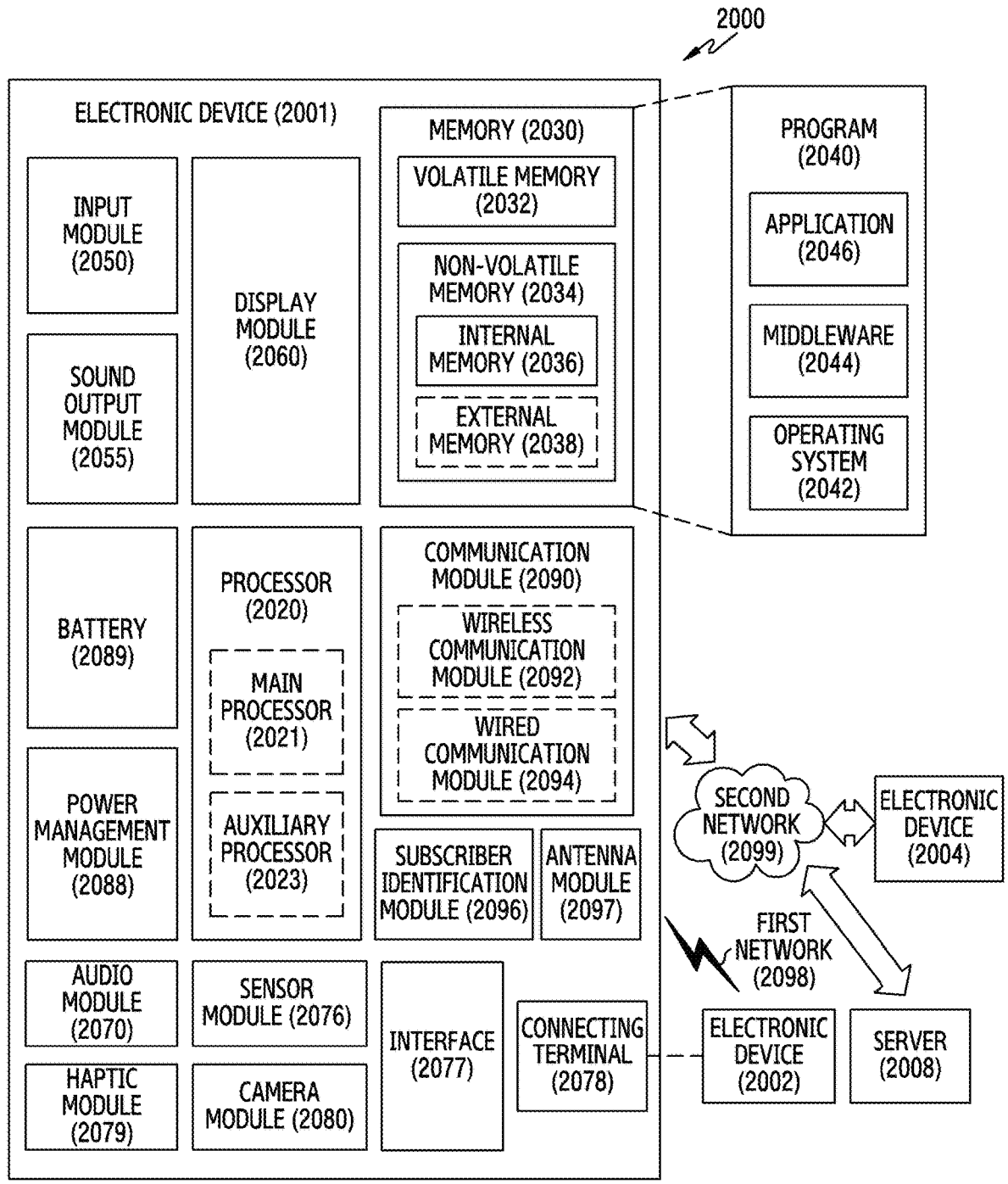
FIG. 20 is a block diagram illustrating an electronic device in a network environment according to an embodiment of the disclosure.

FIG. 20 is a block diagram illustrating an electronic device in a network environment according to an embodiment of the disclosure.

Referring to FIG. 20, an electronic device 2001 in a network environment 2000 may communicate with an electronic device 2002 via a first network 2098 (e.g., a short-range wireless communication network), or at least one of an electronic device 2004 or a server 2008 via a second network 2099 (e.g., a long-range wireless communication network). According to an embodiment of the disclosure, the electronic device 2001 may communicate with the electronic device 2004 via the server 2008. According to an embodiment of the disclosure, the electronic device 2001 may include a processor 2020, a memory 2030, an input module 2050, a sound output module 2055, a display module 2060, an audio module 2070, a sensor module 2076, an interface 2077, a connecting terminal 2078, a haptic module 2079, a camera module 2080, a power management module 2088, a battery 2089, a communication module 2090, a subscriber identification module (SIM) 2096, or an antenna module 2097. In some embodiments of the disclosure, at least one of the components (e.g., the connecting terminal 2078) may be omitted from the electronic device 2001, or one or more other components may be added in the electronic device 2001. In some embodiments of the disclosure, some of the components (e.g., the sensor module 2076, the camera module 2080, or the antenna module 2097) may be implemented as a single component (e.g., the display module 2060).

The processor 2020 may execute, for example, software (e.g., a program 2040) to control at least one other component (e.g., a hardware or software component) of the electronic device 2001 coupled with the processor 2020, and may perform various data processing or computation. According to one embodiment of the disclosure, as at least part of the data processing or computation, the processor 2020 may store a command or data received from another component (e.g., the sensor module 2076 or the communication module 2090) in a volatile memory 2032, process the command or the data stored in the volatile memory 2032, and store resulting data in a non-volatile memory 2034. According to an embodiment of the disclosure, the processor 2020 may include a main processor 2021 (e.g., a central processing unit (CPU) or an application processor (AP)), or an auxiliary processor 2023 (e.g., a graphics processing unit (GPU), a neural processing unit (NPU), an image signal processor (ISP), a sensor hub processor, or a communication processor (CP)) that is operable independently from, or in conjunction with, the main processor 2021. For example, when the electronic device 2001 includes the main processor 2021 and the auxiliary processor 2023, the auxiliary processor 2023 may be adapted to consume less power than the main processor 2021, or to be specific to a specified function. The auxiliary processor 2023 may be implemented as separate from, or as part of the main processor 2021.

The auxiliary processor 2023 may control at least some of functions or states related to at least one component (e.g., the display module 2060, the sensor module 2076, or the communication module 2090) among the components of the electronic device 2001, instead of the main processor 2021 while the main processor 2021 is in an inactive (e.g., sleep) state, or together with the main processor 2021 while the main processor 2021 is in an active state (e.g., executing an application). According to an embodiment of the disclosure, the auxiliary processor 2023 (e.g., an image signal processor or a communication processor) may be implemented as part of another component (e.g., the camera module 2080 or the communication module 2090) functionally related to the auxiliary processor 2023. According to an embodiment of the disclosure, the auxiliary processor 2023 (e.g., the neural processing unit) may include a hardware structure specified for artificial intelligence model processing. An artificial intelligence model may be generated by machine learning. Such learning may be performed, e.g., by the electronic device 2001 where the artificial intelligence is performed or via a separate server (e.g., the server 2008). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 2030 may store various data used by at least one component (e.g., the processor 2020 or the sensor module 2076) of the electronic device 2001. The various data may include, for example, software (e.g., the program 2040) and input data or output data for a command related thereto. The memory 2030 may include the volatile memory 2032 or the non-volatile memory 2034.

The program 2040 may be stored in the memory 2030 as software, and may include, for example, an operating system (OS) 2042, middleware 2044, or an application 2046.

The input module 2050 may receive a command or data to be used by another component (e.g., the processor 2020) of the electronic device 2001, from the outside (e.g., a user) of the electronic device 2001. The input module 2050 may include, for example, a microphone, a mouse, a keyboard, a key (e.g., a button), or a digital pen (e.g., a stylus pen).

The sound output module 2055 may output sound signals to the outside of the electronic device 2001. The sound output module 2055 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 2060 may visually provide information to the outside (e.g., a user) of the electronic device 2001. The display module 2060 may include, for example, a display, a hologram device, or a projector and control circuitry to control a corresponding one of the display, hologram device, and projector. According to an embodiment of the disclosure, the display module 2060 may include a touch sensor adapted to detect a touch, or a pressure sensor adapted to measure the intensity of force incurred by the touch.

The audio module 2070 may convert a sound into an electrical signal and vice versa. According to an embodiment of the disclosure, the audio module 2070 may obtain the sound via the input module 2050, or output the sound via the sound output module 2055 or a headphone of an external electronic device (e.g., an electronic device 2002) directly (e.g., wiredly) or wirelessly coupled with the electronic device 2001.

The sensor module 2076 may detect an operational state (e.g., power or temperature) of the electronic device 2001 or an environmental state (e.g., a state of a user) external to the electronic device 2001, and then generate an electrical signal or data value corresponding to the detected state. According to an embodiment of the disclosure, the sensor module 2076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2077 may support one or more specified protocols to be used for the electronic device 2001 to be coupled with the external electronic device (e.g., the electronic device 2002) directly (e.g., wiredly) or wirelessly. According to an embodiment of the disclosure, the interface 2077 may include, for example, a high-definition multimedia interface (HDMI), a universal serial bus (USB) interface, a secure digital (SD) card interface, or an audio interface.

A connecting terminal 2078 may include a connector via which the electronic device 2001 may be physically connected with the external electronic device (e.g., the electronic device 2002). According to an embodiment of the disclosure, the connecting terminal 2078 may include, for example, a HDMI connector, a USB connector, a SD card connector, or an audio connector (e.g., a headphone connector).

The haptic module 2079 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 2079 may include, for example, a motor, a piezoelectric element, or an electric stimulator.

The camera module 2080 may capture a still image or moving images. According to an embodiment of the disclosure, the camera module 2080 may include one or more lenses, image sensors, image signal processors, or flashes.

The power management module 2088 may manage power supplied to the electronic device 2001. According to one embodiment of the disclosure, the power management module 2088 may be implemented as at least part of, for example, a power management integrated circuit (PMIC).

The battery 2089 may supply power to at least one component of the electronic device 2001. According to an embodiment of the disclosure, the battery 2089 may include, for example, a primary cell which is not rechargeable, a secondary cell which is rechargeable, or a fuel cell.

The communication module 2090 may support establishing a direct (e.g., wired) communication channel or a wireless communication channel between the electronic device 2001 and the external electronic device (e.g., the electronic device 2002, the electronic device 2004, or the server 2008) and performing communication via the established communication channel. The communication module 2090 may include one or more communication processors that are operable independently from the processor 2020 (e.g., the application processor (AP)) and supports a direct (e.g., wired) communication or a wireless communication. According to an embodiment of the disclosure, the communication module 2090 may include a wireless communication module 2092 (e.g., a cellular communication module, a short-range wireless communication module, or a global navigation satellite system (GNSS) communication module) or a wired communication module 2094 (e.g., a local area network (LAN) communication module or a power line communication (PLC) module). A corresponding one of these communication modules may communicate with the external electronic device via the first network 2098 (e.g., a short-range communication network, such as Bluetooth™, wireless-fidelity (Wi-Fi) direct, or infrared data association (IrDA)) or the second network 2099 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 2092 may identify and authenticate the electronic device 2001 in a communication network, such as the first network 2098 or the second network 2099, using subscriber information (e.g., international mobile subscriber identity (IMSI)) stored in the subscriber identification module 2096.

The wireless communication module 2092 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 2092 may support a high-frequency band (e.g., the mm Wave band) to achieve, e.g., a high data transmission rate. The wireless communication module 2092 may support various technologies for securing performance on a high-frequency band, such as, e.g., beamforming, massive multiple-input and multiple-output (massive MIMO), full dimensional MIMO (FD-MIMO), array antenna, analog beam-forming, or large-scale antenna. The wireless communication module 2092 may support various requirements specified in the electronic device 2001, an external electronic device (e.g., the electronic device 2004), or a network system (e.g., the second network 2099). According to an embodiment of the disclosure, the wireless communication module 2092 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 2097 may transmit or receive a signal or power to or from the outside (e.g., the external electronic device) of the electronic device 2001. According to an embodiment of the disclosure, the antenna module 2097 may include an antenna including a radiating element composed of a conductive material or a conductive pattern formed in or on a substrate (e.g., a printed circuit board (PCB)). According to an embodiment of the disclosure, the antenna module 2097 may include a plurality of antennas (e.g., array antennas). In such a case, at least one antenna appropriate for a communication scheme used in the communication network, such as the first network 2098 or the second network 2099, may be selected, for example, by the communication module 2090 (e.g., the wireless communication module 2092) from the plurality of antennas. The signal or the power may then be transmitted or received between the communication module 2090 and the external electronic device via the selected at least one antenna. According to an embodiment of the disclosure, another component (e.g., a radio frequency integrated circuit (RFIC)) other than the radiating element may be additionally formed as part of the antenna module 2097.

According to various embodiments of the disclosure, the antenna module 2097 may form a mmWave antenna module. According to an embodiment of the disclosure, the mm Wave antenna module may include a printed circuit board, a RFIC disposed on a first surface (e.g., the bottom surface) of the printed circuit board, or adjacent to the first surface and capable of supporting a designated high-frequency band (e.g., the mm Wave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 2001 and the external electronic device 2004 via the server 2008 coupled with the second network 2099. Each of the electronic devices 2002 or 2004 may be a device of a same type as, or a different type, from the electronic device 2001. According to an embodiment of the disclosure, all or some of operations to be executed at the electronic device 2001 may be executed at one or more of the external electronic devices 2002, 2004, or 2008. For example, if the electronic device 2001 should perform a function or a service automatically, or in response to a request from a user or another device, the electronic device 2001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2001. The electronic device 2001 may provide the outcome, with or without further processing of the outcome, as at least part of a reply to the request. To that end, a cloud computing, distributed computing, mobile edge computing (MEC), or client-server computing technology may be used, for example. The electronic device 2001 may provide ultra low-latency services using, e.g., distributed computing or mobile edge computing. In another embodiment of the disclosure, the external electronic device 2004 may include an internet-of-things (IoT) device. The server 2008 may be an intelligent server using machine learning and/or a neural network. According to an embodiment of the disclosure, the external electronic device 2004 or the server 2008 may be included in the second network 2099. The electronic device 2001 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 2040) including one or more instructions that are stored in a storage medium (e.g., an internal memory 2036 or an external memory 2038) that is readable by a machine (e.g., the electronic device 2001). For example, a processor (e.g., the processor 2020) of the machine (e.g., the electronic device 2001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively, or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added. A PBA according to an embodiment may include first printed circuit board (PCB), a second PCB disposed parallel to the first PCB and configured to include a conductive area, a first interposer surrounding a space between the first PCB and the second PCB, and a wireless communication circuit, wherein the first interposer may include a first partition wall structure configured to provide shielding for at least one electronic component disposed in the PBA; and a second partition wall structure connected to the first partition wall structure and including an dielectric material, the second partition wall structure including a conductive via configured to connect the first PCB and the second PCB, and the wireless communication circuit may transmit and/or receive a signal in a specified frequency band by feeding power to the conductive area of the second PCB through the conductive via.

According to an embodiment of the disclosure, the at least one electronic component may be disposed in the space of the PBA.

According to an embodiment of the disclosure, the space may include a first space surrounded by the first partition wall structure and a second space surrounded by the first partition wall structure and the second partition wall structure, a first electronic component disposed in the first space, and a second electronic component disposed in the second space.

According to an embodiment of the disclosure, the at least one electronic component may be disposed on the second PCB.

According to an embodiment of the disclosure, the PBA may include a third PCB disposed parallel to the first PCB and the second PCB, a second interposer surrounding a space between the second PCB and the third PCB, a first electronic component disposed in the space between the second PCB and the third PCB, and a second electronic component disposed in the space between the first PCB and the second PCB may be included, wherein the second interposer may provide shielding for the at least one electronic component disposed on the second PCB.

According to an embodiment of the disclosure, the first partition wall structure may include at least one of multiple conductive vias and a lateral plated part.

According to an embodiment of the disclosure, the wireless communication circuit may be disposed on the first PCB or the second PCB and electrically connected to the first PCB and the second PCB.

According to an embodiment of the disclosure, the specified frequency band may include an ultra-wide band (UWB) of 5 GHz to 8 GHz.

According to an embodiment of the disclosure, the interposer may include a first edge, a second edge perpendicularly connected to the first edge, a third edge perpendicularly connected to the second edge and disposed parallel to the first edge, and a fourth edge connected to the first edge and the third edge, wherein the fourth edge may include the second partition wall structure.

According to an embodiment of the disclosure, the first edge and the second edge may include the first partition wall structure and the third edge may include the first partition wall structure and the second partition wall structure.

According to an embodiment of the disclosure, the first edge may include the first partition wall structure, the second edge may include the first partition wall structure and the second partition wall structure, and the third edge may include the second partition wall structure.

According to an embodiment of the disclosure, the first PCB may include a first ground, the second PCB may include a second ground, wherein the first ground and the second ground may be electrically connected to each other through the multiple conductive vias.

According to an embodiment of the disclosure, the first electronic component may generate a noise according to power feeding to the conductive area by the wireless communication circuit.

According to an embodiment of the disclosure, the wireless communication circuit may be electrically connected to the first PCB and/or the second PCB through a flexible printed circuit board (FPCB).

According to an embodiment of the disclosure, the PBA may further include a shield can adjacent to the first PCB or the second PCB, wherein the wireless communication circuit may transmit or receive a signal in a specified frequency band by feeding power to the conductive area through the shield can.

According to an embodiment of the disclosure, an electronic device may include a housing including a first housing and a second housing coupled to the first housing to be movable with respect to the first housing, a flexible display coupled to the housing and configured to have a display area shown to the outside the electronic device and expanded or reduced in at least one direction according to the movement of the second housing, a PBA disposed in the housing, and a wireless communication circuit are included, wherein the PBA may include a first printed circuit board (PCB), a second PCB disposed parallel to the first PCB, the second PCB including a conductive area, an interposer surrounding a space between the first PCB and the second PCB, wherein the interposer may include a first partition wall structure configured to provide shielding for at least one electronic component disposed in the PBA and a second partition wall structure connected to the first partition wall structure and configured to include an dielectric material, the second partition wall structure including a conductive via configured to connect the first PCB and the second PCB, wherein the wireless communication circuit may transmit or receive a signal in a specified frequency band by feeding power to the conductive area of the second PCB through the conductive via.

According to an embodiment of the disclosure, the space may include a first space surrounded by the first partition wall structure and a second space surrounded by the first partition wall structure and the second partition wall structure, a first electronic component disposed in the first space, and a second electronic component disposed in the second space.

According to an embodiment of the disclosure, the electronic device may include a third PCB disposed parallel to the first PCB and the second PCB, a second interposer surrounding a space between the second PCB and the third PCB, the second interposer providing shielding for at least one electronic component disposed on the PBA, a first electronic component disposed in the space between the second PCB and the third PCB, and a second electronic component disposed in the space between the first PCB and the second PCB may be included.

According to an embodiment of the disclosure, the specified frequency band may include an ultra-wide band (UWB) of 5 GHz to 8 GHz.

According to an embodiment of the disclosure, the wireless communication circuit may be disposed on the first PCB or the second PCB and electrically connected to the first PCB and the second PCB.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A printed board assembly (PBA) comprising:
   a first printed circuit board (PCB);
   a second PCB disposed parallel to the first PCB and configured to comprise a conductive area;
   a first interposer surrounding a space between the first PCB and the second PCB;
   a shield can adjacent to the first PCB or the second PCB; and
   a wireless communication circuit,
   wherein the first interposer comprises:
     a first partition wall structure configured to provide shielding for at least one electronic component disposed on the PBA, and
     a second partition wall structure connected to the first partition wall structure and configured to comprise a dielectric material, the second partition wall structure comprising a conductive via configured to connect the first PCB and the second PCB,
   wherein the wireless communication circuit is configured to transmit and/or receive a signal in a specified frequency band by feeding power to the conductive area of the second PCB through the conductive via,
   wherein a power feeding line disposed on the first PCB and electrically connected to a wireless communication circuit is electrically connected to a second ground of the second PCB through the conductive via,
   wherein the at least one electronic component is disposed in the space,
   wherein the space comprises:
     a first space surrounded by the first partition wall structure, and
     a second space surrounded by the first partition wall structure and the second partition wall structure,
   wherein the PBA comprises:
     a first electronic component disposed in the first space, and
     a second electronic component disposed in the second space, and
   wherein the wireless communication circuit transmits or receives a signal in a specified frequency band by feeding power to the conductive area through the shield can.

2. The PBA of claim 1, wherein the at least one electronic component is disposed on the second PCB.

3. The PBA of claim 2, further comprising:
   a third PCB disposed parallel to the first PCB and the second PCB;
   a second interposer surrounding a space between the second PCB and the third PCB, the second interposer providing shielding for the at least one electronic component disposed on the second PCB;
   a first electronic component disposed in the space between the second PCB and the third PCB; and
   a second electronic component disposed in the space between the first PCB and the second PCB.

4. The PBA of claim 1, wherein the first partition wall structure comprises at least one of multiple conductive vias and a lateral plated part.

5. The PBA of claim 1, wherein the wireless communication circuit is disposed on the first PCB or the second PCB and electrically connected to the first PCB and the second PCB.

6. The PBA of claim 1, wherein the specified frequency band comprises an ultra-wide band (UWB) of 5 GHz to 8 GHz.

7. The PBA of claim 1,
   wherein the interposer comprises a first edge, a second edge perpendicularly connected to the first edge, a third edge perpendicularly connected to the second edge and disposed parallel to the first edge, and a fourth edge connected to the first edge and the third edge, and
   wherein the fourth edge comprises the second partition wall structure.

8. The PBA of claim 7,
   wherein the first edge and the second edge comprise the first partition wall structure, and
   wherein the third edge comprises the first partition wall structure and the second partition wall structure.

9. The PBA of claim 7,
   wherein the first edge comprises the first partition wall structure,
   wherein the second edge comprises the first partition wall structure and the second partition wall structure, and
   wherein the third edge comprises the second partition wall structure.

10. The PBA of claim 4,
    wherein the first PCB comprises a first ground,
    wherein the second PCB comprises the second ground, and
    wherein the first ground and the second ground are electrically connected to each other through the multiple conductive vias.

11. The PBA of claim 1, wherein the first electronic component generates a noise according to power feeding to the conductive area by the wireless communication circuit.

12. The PBA of claim 1, wherein the wireless communication circuit is electrically connected to the first PCB and/or the second PCB through a flexible printed circuit board (FPCB).

13. An electronic device comprising:
a housing comprising a first housing and a second housing coupled to the first housing to be movable with respect to the first housing;
a flexible display coupled to the housing and having a display area shown to the outside of the electronic device and expanded or reduced in at least one direction according to a movement of the second housing;
a printed board assembly (PBA) disposed in the housing; and
a wireless communication circuit,
wherein the PBA comprises:
a first printed circuit board (PCB),
a second PCB disposed parallel to the first PCB, the second PCB comprising a conductive area,
a shield can adjacent to the first PCB or the second PCB, and
an interposer surrounding a space between the first PCB and the second PCB,
wherein the interposer comprises:
a first partition wall structure configured to provide shielding for at least one electronic component disposed on the PBA, and
a second partition wall structure connected to the first partition wall structure and configured to comprise a dielectric material, the second partition wall structure comprising a conductive via configured to connect the first PCB and the second PCB,
wherein the wireless communication circuit is configured to transmit or receive a signal in a specified frequency band by feeding power to the conductive area of the second PCB through the conductive via,
wherein a power feeding line disposed on the first PCB and electrically connected to a wireless communication circuit is electrically connected to a second ground of the second PCB through the conductive via,
wherein the space comprises:
a first space surrounded by the first partition wall structure, and
a second space surrounded by the first partition wall structure and the second partition wall structure,
wherein the PBA comprises:
a first electronic component disposed in the first space, and
a second electronic component disposed in the second space, and
wherein the wireless communication circuit transmits or receives a signal in a specified frequency band by feeding power to the conductive area through the shield can.

14. The electronic device of claim 13, further comprising:
a third PCB disposed parallel to the first PCB and the second PCB;
a second interposer surrounding a space between the second PCB and the third PCB, the second interposer providing shielding for the at least one electronic component disposed on the PBA;
a first electronic component disposed in the space between the second PCB and the third PCB; and
a second electronic component disposed in the space between the first PCB and the second PCB.

15. The electronic device of claim 13, wherein the specified frequency band comprises an ultra-wide band (UWB) of 5 GHz to 8 GHz.

16. The electronic device of claim 13, wherein the wireless communication circuit is disposed on the first PCB or the second PCB and electrically connected to the first PCB and the second PCB.

* * * * *